United States Patent
Tamura

(10) Patent No.: US 11,862,586 B2
(45) Date of Patent: Jan. 2, 2024

(54) SEMICONDUCTOR DEVICE AND METHOD OF MANUFACTURING THE SAME

(71) Applicant: Kioxia Corporation, Tokyo (JP)

(72) Inventor: Mizuki Tamura, Nagoya (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 17/644,383

(22) Filed: Dec. 15, 2021

(65) Prior Publication Data

US 2022/0406739 A1 Dec. 22, 2022

(30) Foreign Application Priority Data

Jun. 16, 2021 (JP) .................................. 2021-100408

(51) Int. Cl.
*H01L 27/12* (2006.01)
*H01L 23/00* (2006.01)

(52) U.S. Cl.
CPC .............. *H01L 24/02* (2013.01); *H01L 24/03* (2013.01); *H01L 24/08* (2013.01); *H01L 24/80* (2013.01);
(Continued)

(58) Field of Classification Search
CPC ......... H01L 24/02; H01L 24/03; H01L 24/08; H01L 24/80; H01L 24/05; H01L 2224/02255; H01L 2224/0226; H01L 2224/03011; H01L 2224/03452; H01L 2224/0346; H01L 2224/03845; H01L 2224/05012; H01L 2224/05018; H01L 2224/05073; H01L 2224/05166; H01L 2224/05181; H01L 2224/05552; H01L 2224/05554; H01L 2224/05559; H01L 2224/05573; H01L 2224/05647; H01L 2224/08145; H01L 2924/05442; H01L 2924/351; H01L 21/76877;
(Continued)

(56) References Cited

U.S. PATENT DOCUMENTS 5,731,086 A 3/1998 Gebhardt et al.
5,854,149 A 12/1998 Nagayama et al.
(Continued)

FOREIGN PATENT DOCUMENTS

JP 08-230114 A 9/1996
JP 10-326806 A 12/1998
(Continued)

OTHER PUBLICATIONS

"The charge of non-equipment low- temperature joining method for having used Pori Syros Zhang", 2009, 3 pages (with English Machine Translation), http://memspedia.mmc.or.jp/finememes/index.php?title=%E3%83%9D%E3%83%AA%E3%82%B7%E3%83%A9%E3%82%B6%E3%83%B3%E3%82%92%E7%94%A8%E3%81%84%E3%81%9F%E7%84%A1%E6%A9%9F%E6%9D%90%E6%96%99%E4%BD%8E%E6%B8%A9%E6%8E%A5%E5%90%88%E6%B3%95.

*Primary Examiner* — Niki H Nguyen
(74) *Attorney, Agent, or Firm* — Oblon, McClelland, Maier & Neustadt, L.L.P.

(57) ABSTRACT

In one embodiment, a semiconductor device includes a first insulator, a first pad provided in the first insulator, a second insulator provided on the first insulator, and a second pad provided on the first pad in the second insulator. Furthermore, the first insulator includes a first film that is in contact with the first pad and the second insulator, and a second film provided at an interval from the first pad and the second insulator, and including a portion provided at a same height as at least a portion of the first pad.

18 Claims, 33 Drawing Sheets

(52) U.S. Cl.
CPC ...... *H01L 24/05* (2013.01); *H01L 2224/0226* (2013.01); *H01L 2224/02255* (2013.01); *H01L 2224/03011* (2013.01); *H01L 2224/0346* (2013.01); *H01L 2224/03452* (2013.01); *H01L 2224/03845* (2013.01); *H01L 2224/05012* (2013.01); *H01L 2224/05014* (2013.01); *H01L 2224/05018* (2013.01); *H01L 2224/05073* (2013.01); *H01L 2224/05166* (2013.01); *H01L 2224/05181* (2013.01); *H01L 2224/05552* (2013.01); *H01L 2224/05554* (2013.01); *H01L 2224/05559* (2013.01); *H01L 2224/05573* (2013.01); *H01L 2224/05647* (2013.01); *H01L 2224/08145* (2013.01); *H01L 2224/80007* (2013.01); *H01L 2924/0103* (2013.01); *H01L 2924/01013* (2013.01); *H01L 2924/05442* (2013.01); *H01L 2924/351* (2013.01)

(58) Field of Classification Search
CPC ....... H01L 2224/80895; H01L 2924/00; H01L 2225/06562; H01L 21/76897; H01L 2924/15311; H01L 2224/48091; H01L 2224/05624; H01L 24/48; H01L 2224/16225; H01L 2224/05684; H01L 21/76898; H01L 21/76805; H01L 2224/48145; H01L 2924/13091; H01L 2924/01013; H01L 2924/014; H10B 43/27; H10B 41/27; H10B 43/40; H10B 43/35; H10B 43/50; H10B 43/10; H10B 53/50; H10B 51/10; H10B 51/00; H10B 53/10; H10B 63/10; H10B 41/44; H10B 20/65
See application file for complete search history.

(56) References Cited

U.S. PATENT DOCUMENTS

| | | |
|---|---|---|
| 6,022,757 A | 2/2000 | Andoh |
| 6,479,900 B1 | 11/2002 | Shinogi et al. |
| 6,921,971 B2 | 7/2005 | Basho et al. |
| 6,962,835 B2 | 11/2005 | Tong et al. |
| 7,602,070 B2 | 10/2009 | Tong et al. |
| 7,842,540 B2 | 11/2010 | Tong et al. |
| 8,309,958 B2 | 11/2012 | Hirota et al. |
| 8,524,533 B2 | 9/2013 | Tong et al. |
| 8,847,296 B2 | 9/2014 | Tsukimura et al. |
| 9,343,498 B2 | 5/2016 | Saito |
| 9,613,849 B2 | 4/2017 | Konishi et al. |
| 9,842,879 B2 | 12/2017 | Matsugai |
| 10,529,752 B2 | 1/2020 | Ishiwata et al. |
| 10,643,967 B2 | 5/2020 | Okabe et al. |
| 2021/0167106 A1 | 6/2021 | Fukasawa |
| 2021/0202496 A1* | 7/2021 | Nam ..................... H10B 43/10 |

FOREIGN PATENT DOCUMENTS

| | | |
|---|---|---|
| JP | 11-507601 A | 7/1999 |
| JP | 2000-188306 A | 7/2000 |
| JP | 2004-221328 A | 8/2004 |
| JP | 2006-114847 A | 4/2006 |
| JP | 2008-010694 A | 1/2008 |
| JP | 2012-231085 A | 11/2012 |
| JP | 5118716 B2 | 1/2013 |
| JP | 2016-181531 A | 10/2016 |
| JP | 6017297 B2 | 10/2016 |
| JP | 6021383 B2 | 11/2016 |
| JP | 6239214 B1 | 11/2017 |
| JP | 6265130 B2 | 1/2018 |
| JP | 6315262 B2 | 4/2018 |
| JP | 2019-110260 A | 7/2019 |
| WO | WO 2016/152513 A1 | 9/2016 |
| WO | WO 2017/163924 A1 | 9/2017 |
| WO | WO 2019/124085 A1 | 6/2019 |

* cited by examiner

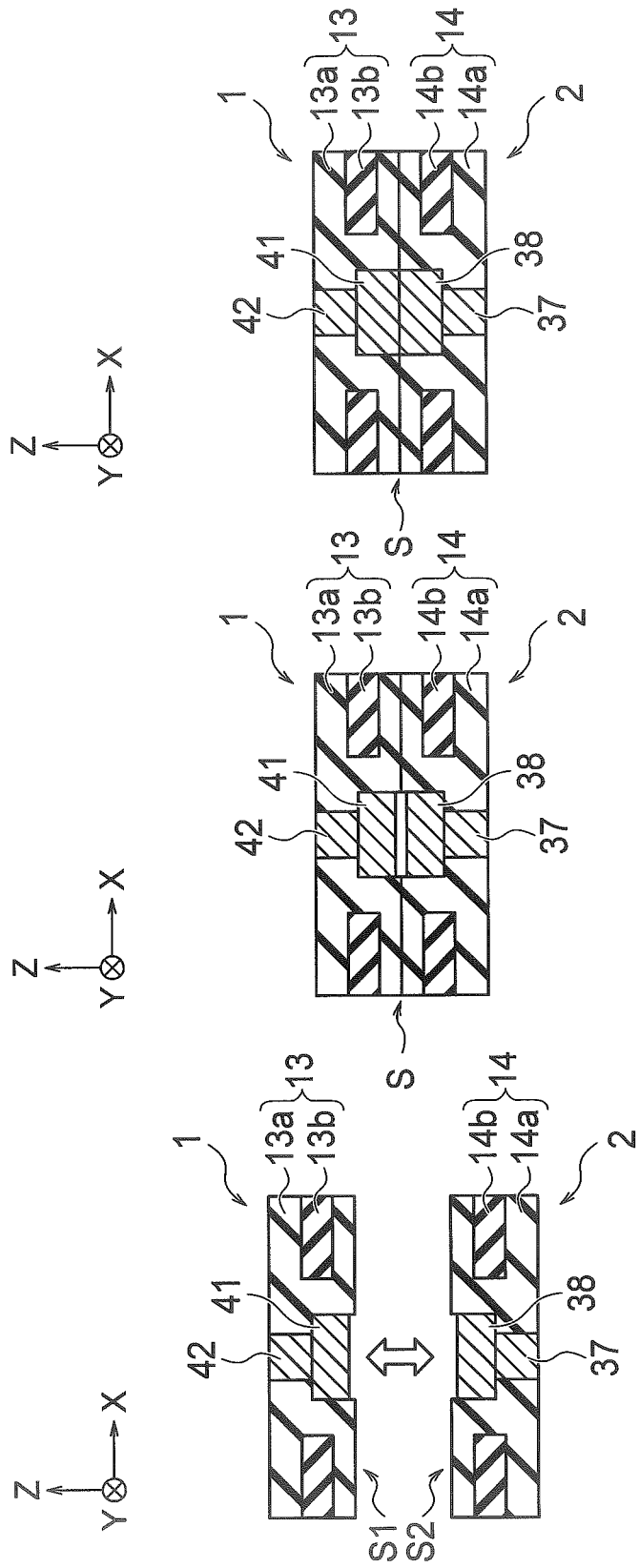

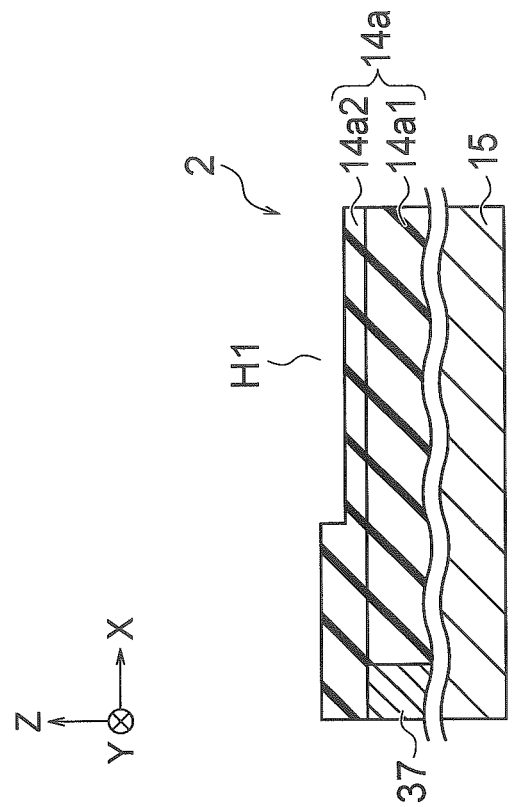
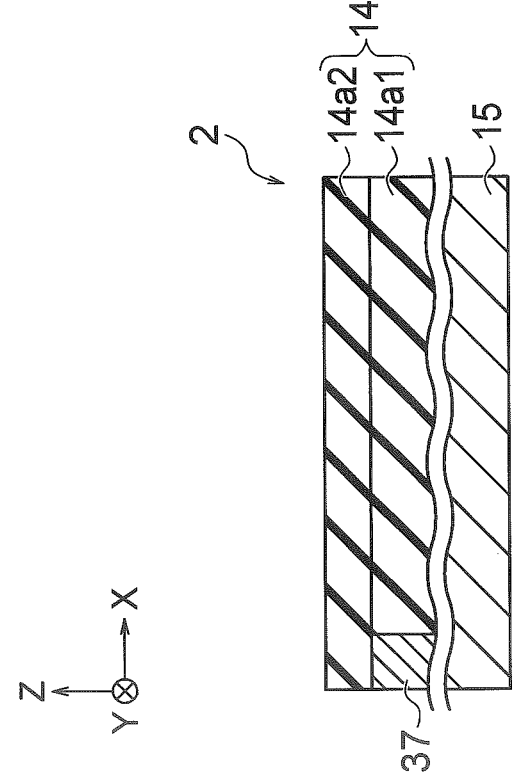

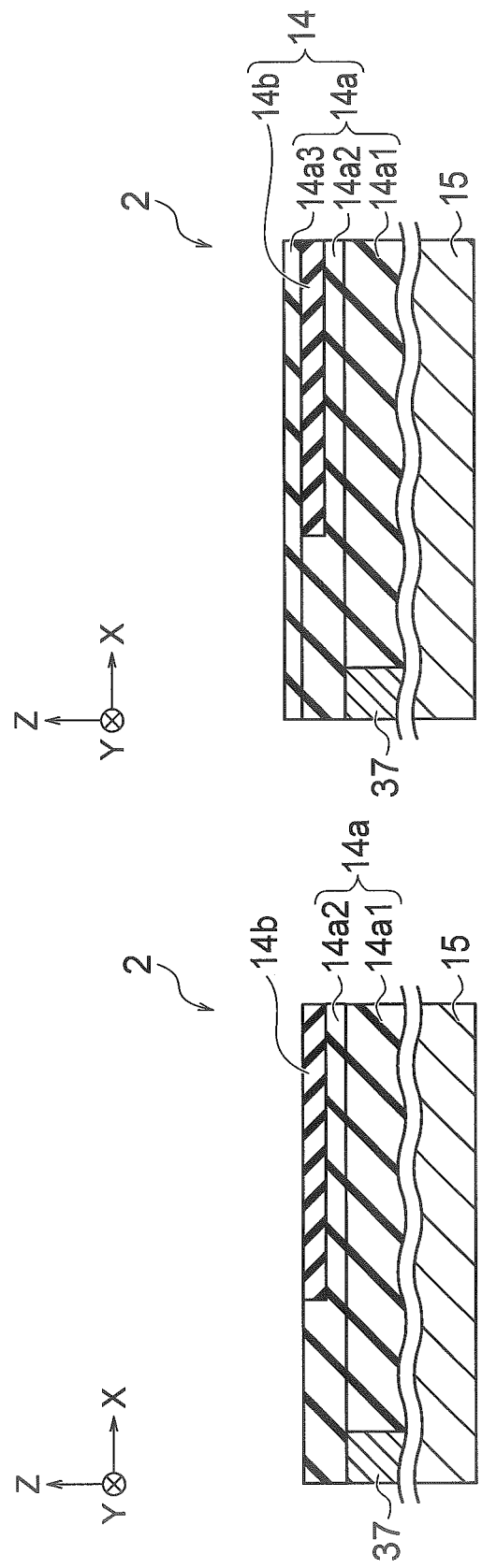

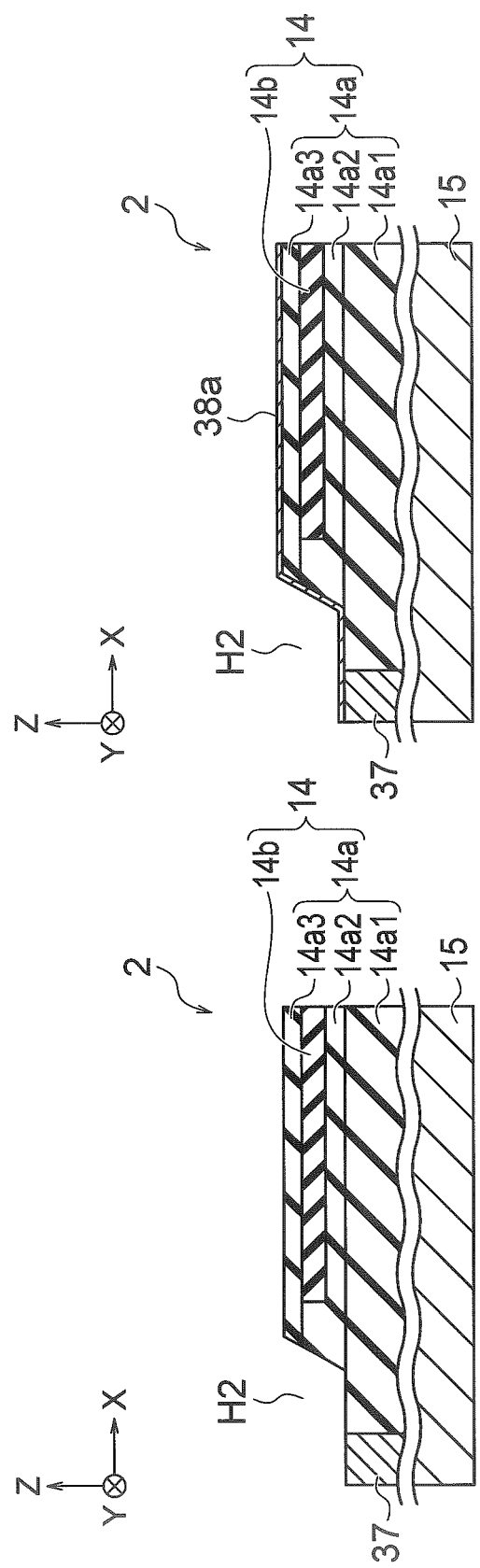

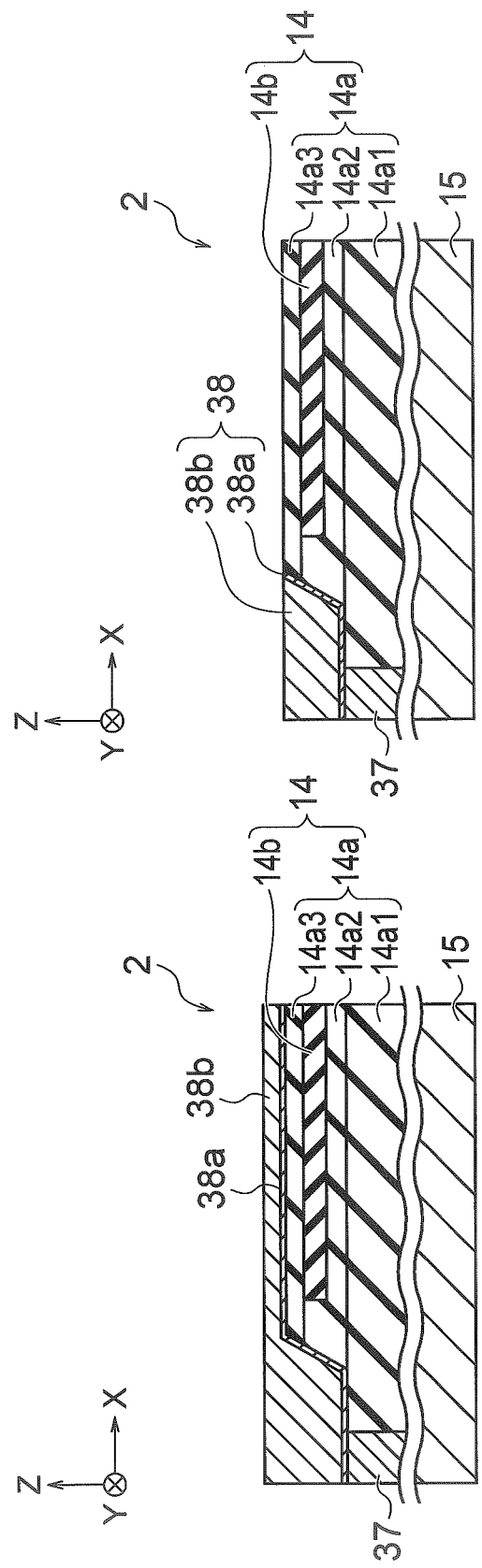

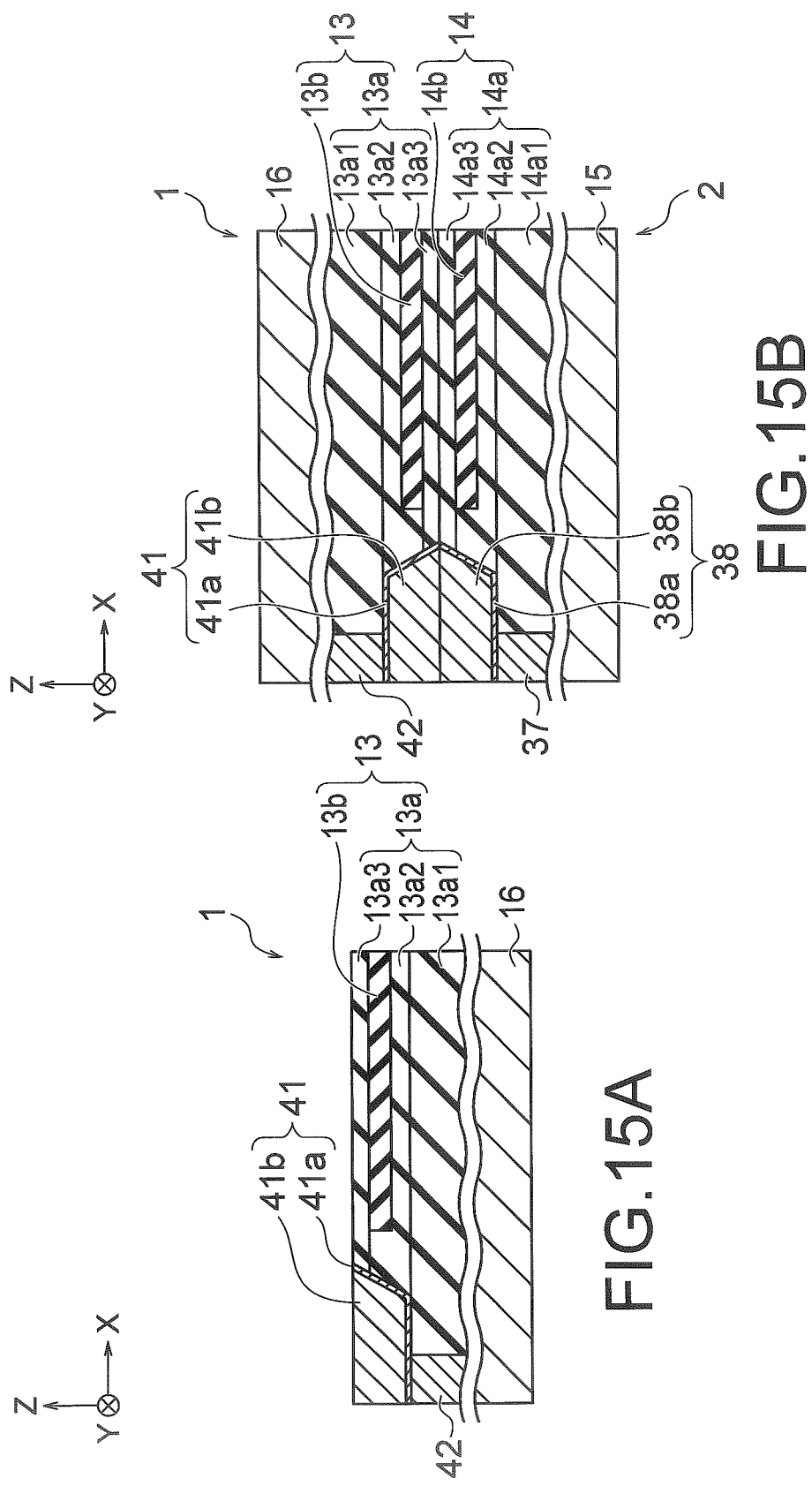

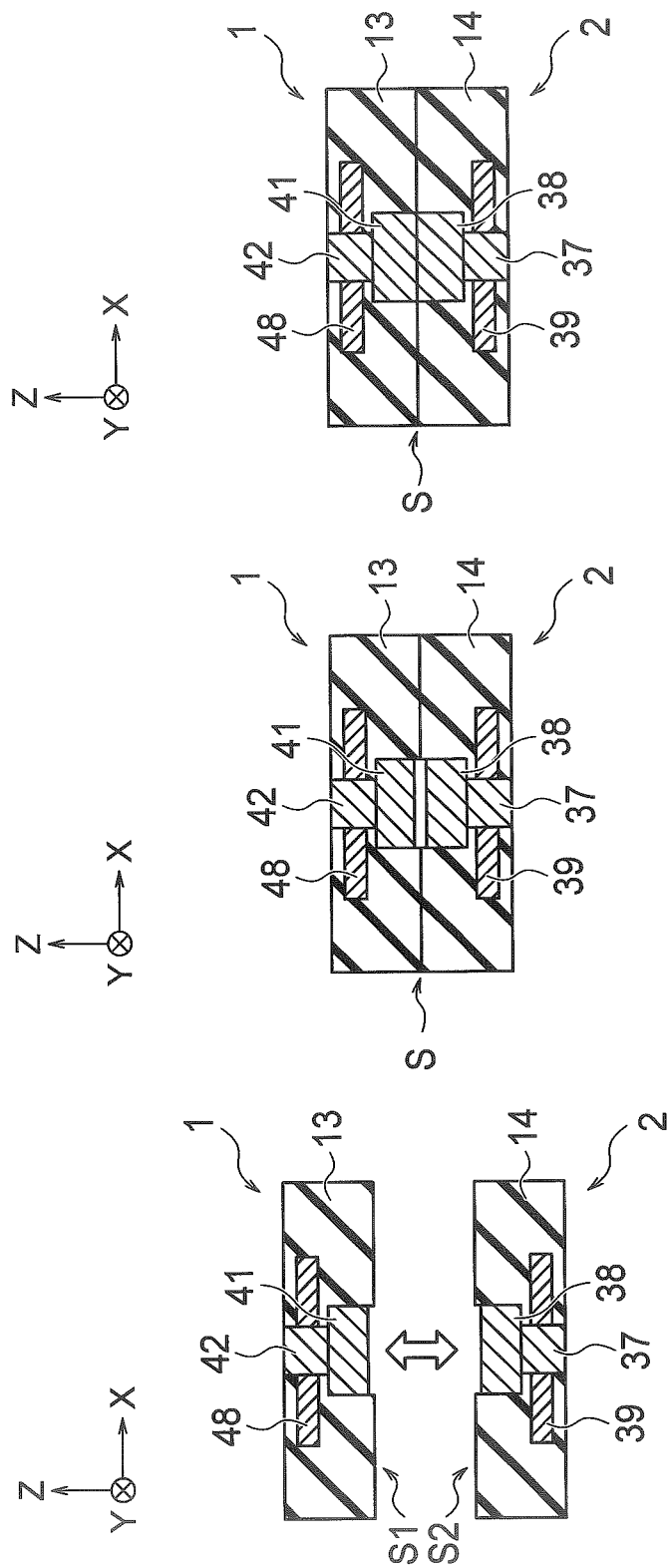

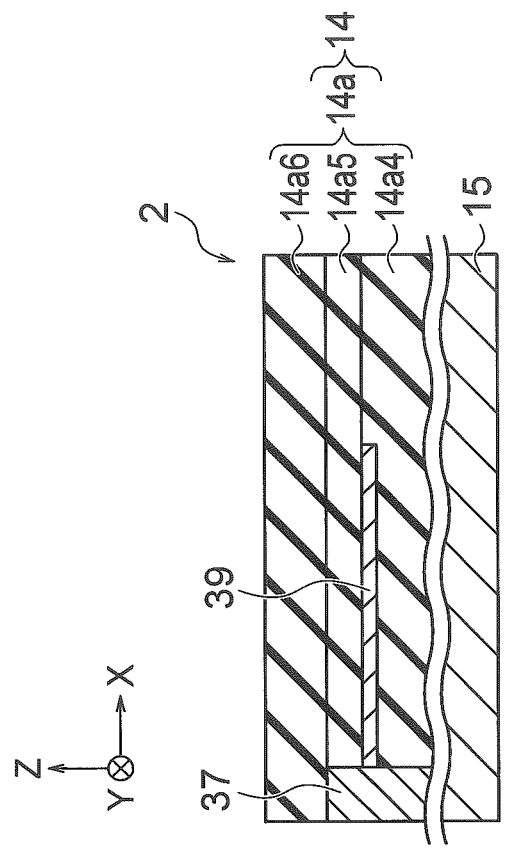
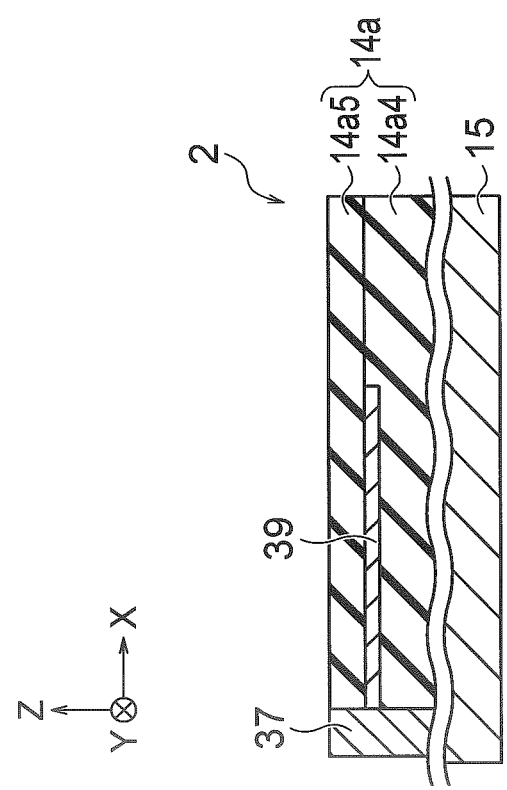

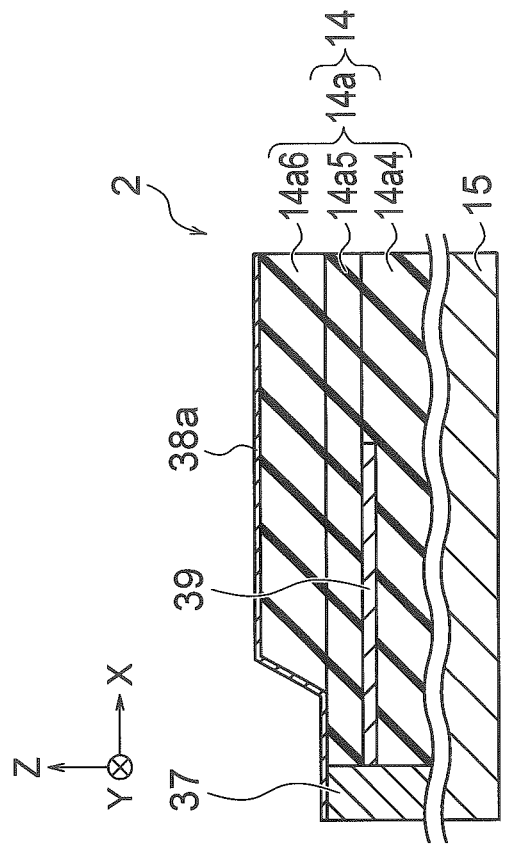
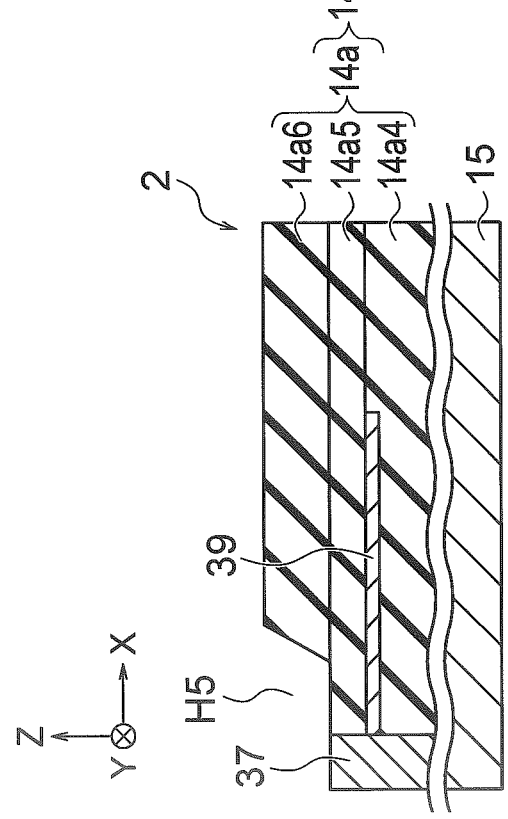

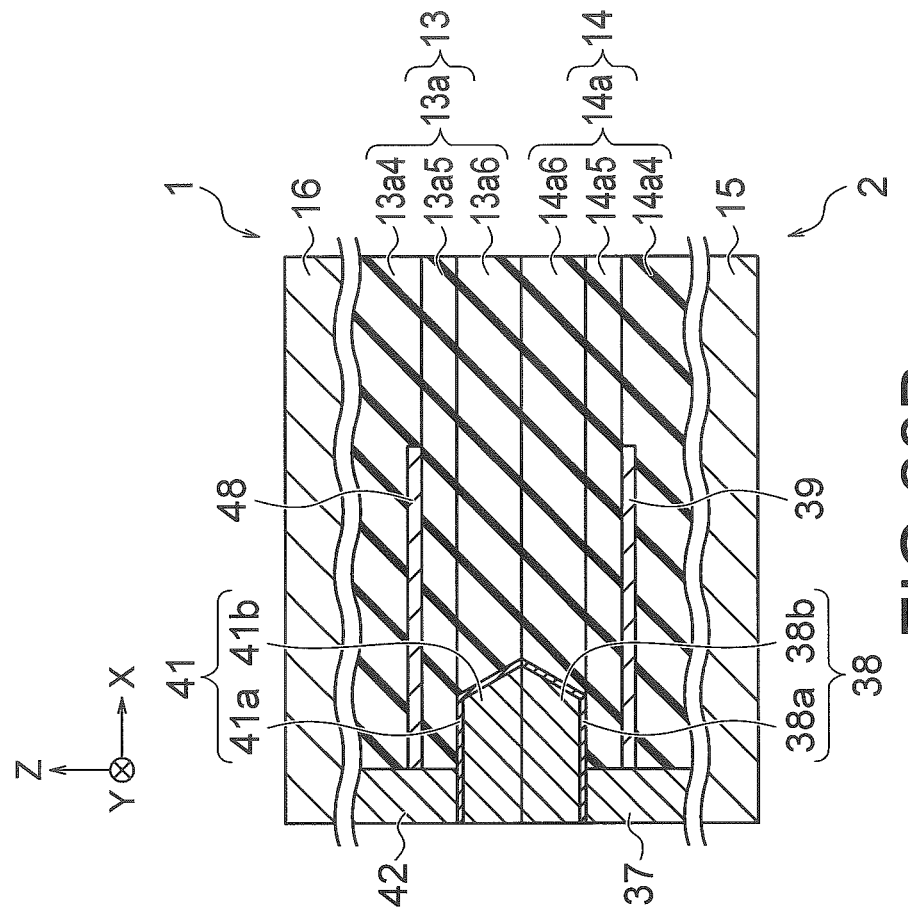
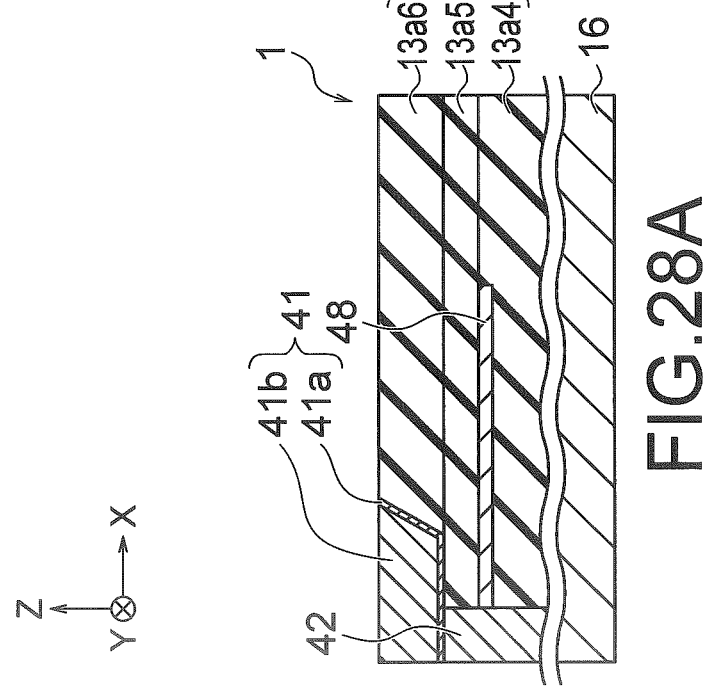
FIG.28A
FIG.28B

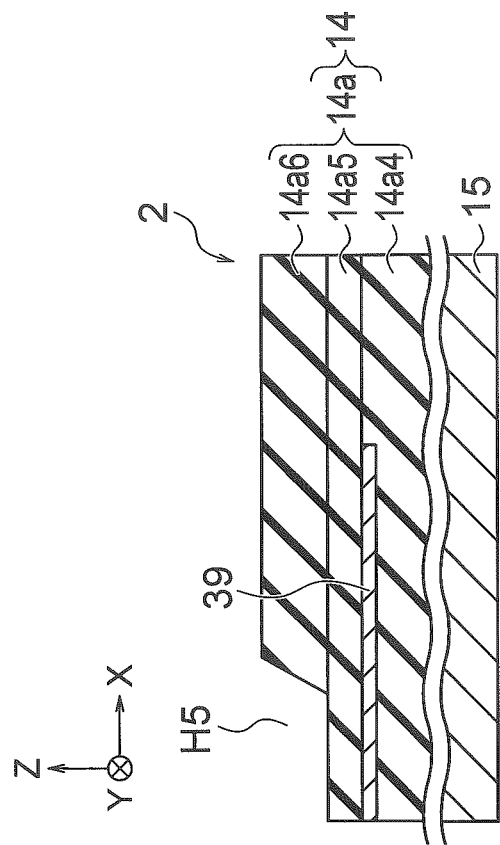
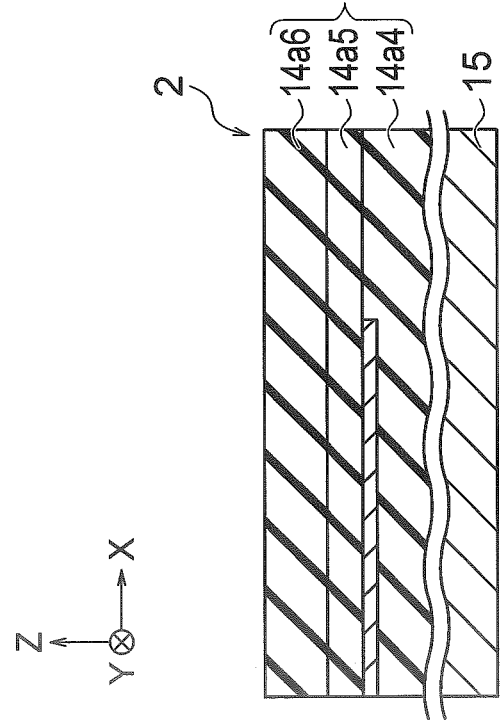

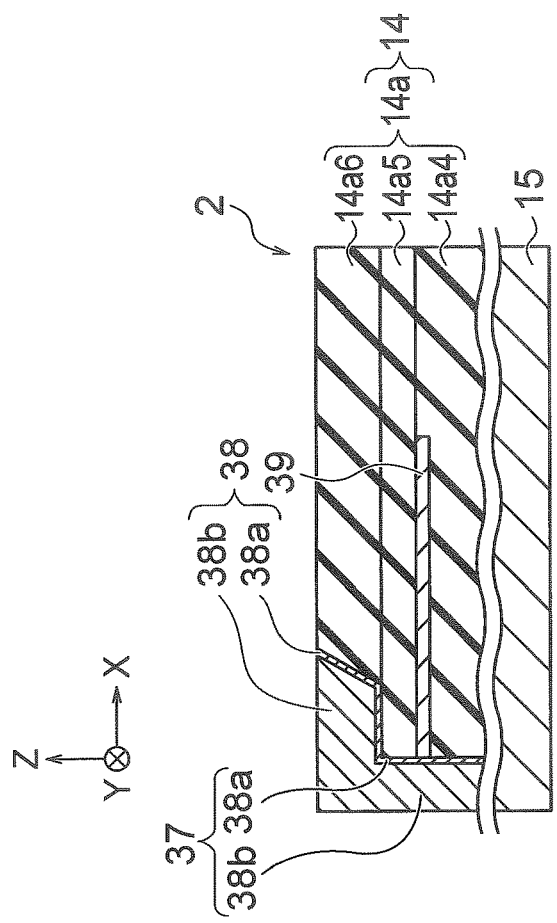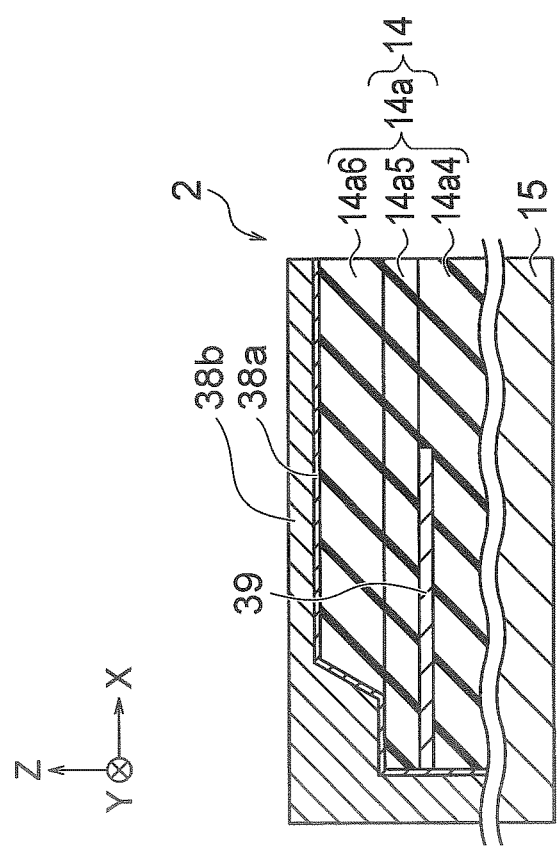

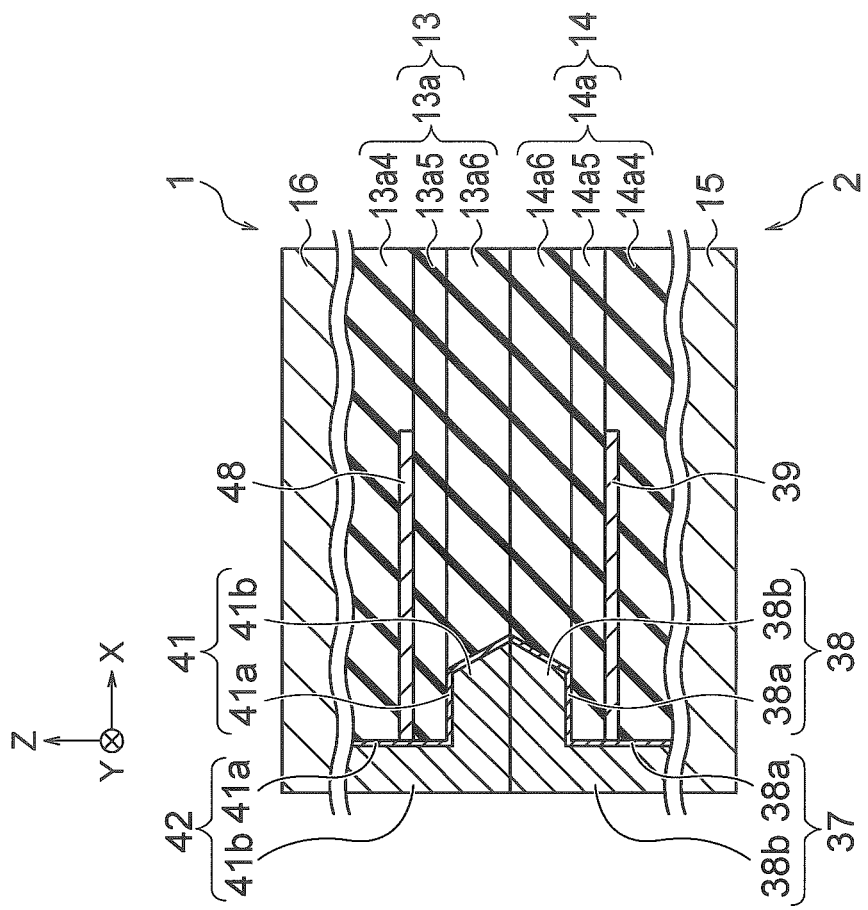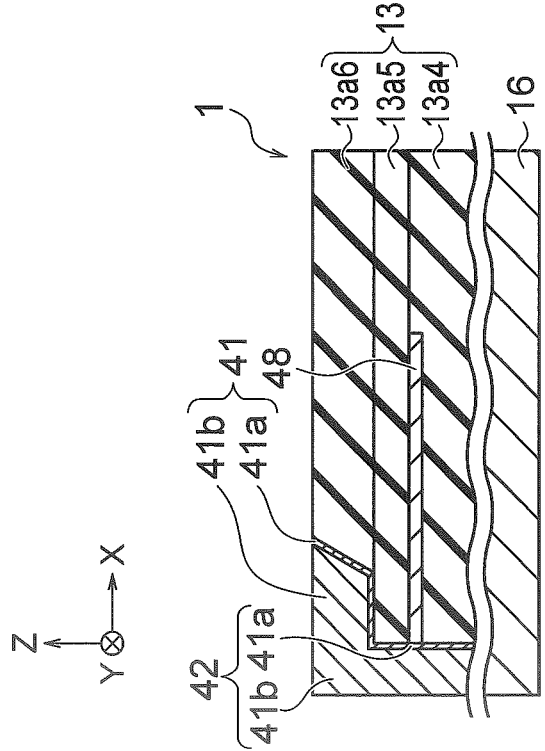
FIG.32A
FIG.32B

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-100408, filed on Jun. 16, 2021, the entire contents of which are incorporated herein by reference.

FIELD

Embodiments described herein relate to a semiconductor device and a method of manufacturing the same.

BACKGROUND

When a semiconductor device is manufactured by bonding a substrate to another substrate, it is desirable to reduce the joining defects between the metal pads of these substrates.

BRIEF DESCRIPTION OF THE DRAWINGS

FIGS. 10A to 10C are cross-sectional views showing an outline of the method of manufacturing the semiconductor device of the first embodiment;

FIGS. 11A to 15B are cross-sectional views showing details of the method of manufacturing the semiconductor device of the first embodiment;

FIGS. 21A to 21C are cross-sectional views showing an outline of a method of manufacturing the semiconductor device of the second embodiment;

FIGS. 22A to 28B are cross-sectional views showing details of the method of manufacturing the semiconductor device of the second embodiment;

FIGS. 29A to 32B are cross-sectional views showing details of another method of manufacturing the semiconductor device of the second embodiment.

DETAILED DESCRIPTION

Embodiments will now be explained with reference to the accompanying drawings. In FIGS. 1 to 33, the same configurations are denoted by the same reference symbols and repeated description is omitted.

In one embodiment, a semiconductor device includes a first insulator, a first pad provided in the first insulator, a second insulator provided on the first insulator, and a second pad provided on the first pad in the second insulator. Furthermore, the first insulator includes a first film that is in contact with the first pad and the second insulator, and a second film provided at an interval from the first pad and the second insulator, and including a portion provided at a same height as at least a portion of the first pad.

First Embodiment

Figure 1:
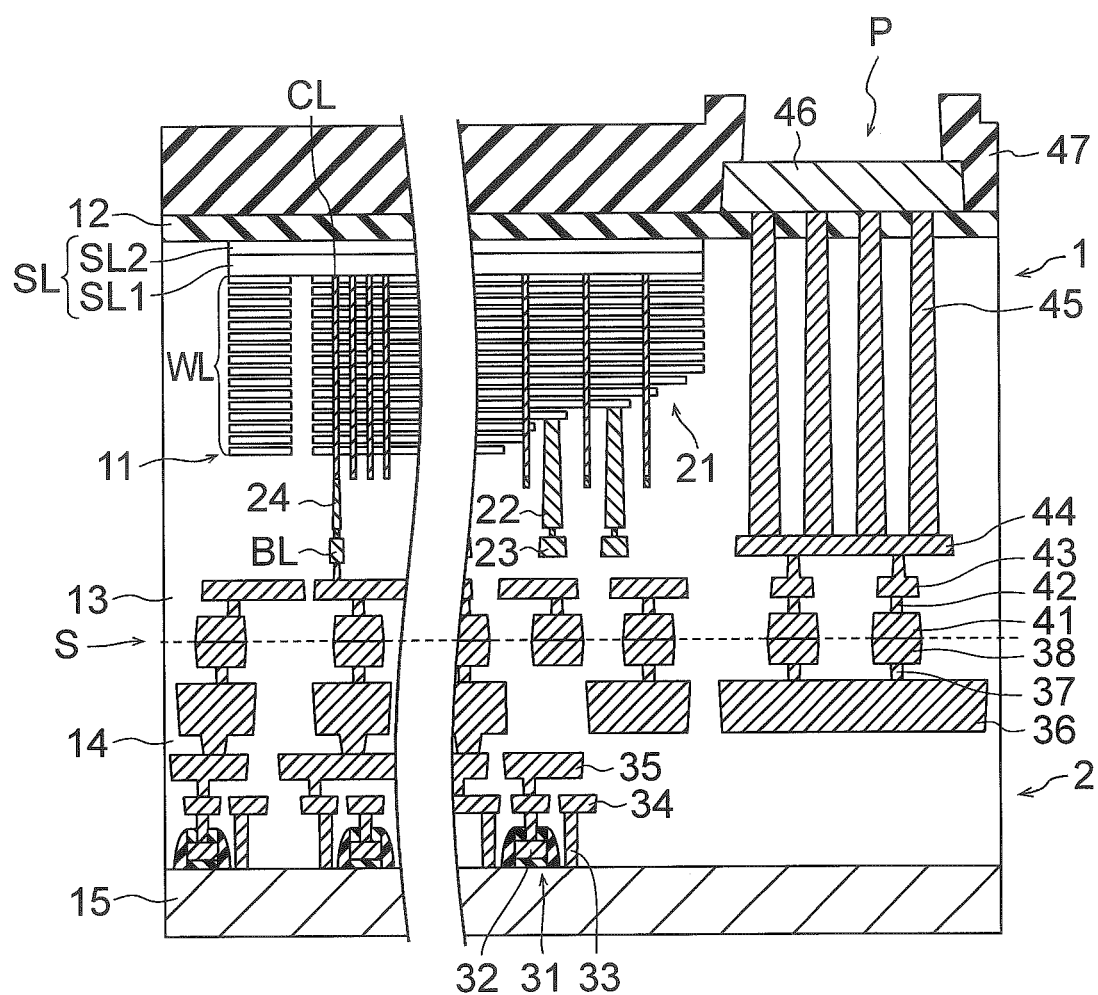
FIG. 1 is a cross-sectional view showing a structure of a semiconductor device of a first embodiment.

FIG. 1 is a cross-sectional view showing a structure of a semiconductor device of a first embodiment. The semiconductor device of FIG. 1 is for example three-dimensional memory, and is manufactured by bonding an array wafer including an array region 1 to a circuit wafer including a circuit region 2 as described later.

The array region 1 is provided with a memory cell array 11 including a plurality of memory cells, an insulator 12 on the memory cell array 11, and an inter layer dielectric 13 under the memory cell array 11. The insulator 12 is for example a silicon oxide film ($SiO_2$ film) or a silicon nitride film (SiN film). The inter layer dielectric 13 is for example a silicon oxide film or a laminated film including a silicon oxide film and another insulator. The inter layer dielectric 13 is an example of the second insulator (or the first insulator).

The circuit region 2 is provided under the array region 1. The reference symbol S denotes an interface (bonded face) between the array region 1 and the circuit region 2. The circuit region 2 is provided with an inter layer dielectric 14 and a substrate 15 under the inter layer dielectric 14. The inter layer dielectric 14 is for example a silicon oxide film or a laminated film including a silicon oxide film and another insulator. The inter layer dielectric 14 is an example of the first insulator (or the second insulator). The substrate 15 is for example a semiconductor substrate such as a silicon (Si) substrate.

FIG. 1 indicates an X direction and a Y direction that are parallel to a surface of the substrate 15 and perpendicular to each other, and a Z direction that is perpendicular to the surface of the substrate 15. In the present specification, a +Z direction is considered to be an upper direction, and −Z direction is considered to be a lower direction. The −Z direction may and may not correspond to the direction of gravity. Although the semiconductor device of FIG. 1 is in a state that the circuit region 2 is under the array region 1, the semiconductor device of FIG. 1 may be in a state that the array region 1 is under the circuit region 2.

The array region 1 is provided with a plurality of word lines WL as a plurality of electrode layers inside the memory cell array 11, and a source line SL. FIG. 1 shows a stepped structure portion 21 of the memory cell array 11. Each of the word lines WL is electrically connected to the word interconnect layer 23 via a contact plug 22. Each of columnar portions CL penetrating the plurality of word lines WL is electrically connected to a bit line BL via a via plug 24, and electrically connected to the source line SL. The source line SL includes a lower layer SL1 which is a semiconductor layer, and an upper layer SL2 which is a metal layer.

The circuit region 2 is provided with a plurality of transistors 31. Each of the transistors 31 includes a gate electrode 32 provided on the substrate 15 via a gate insulator, and a source diffusion layer and a drain diffusion layer (not illustrated) provided in the substrate 15. The circuit region 2 includes a plurality of contact plugs 33 provided on the gate electrodes 32, the source diffusion layers, or the drain diffusion layers of these transistors 31, an interconnect layer 34 provided on these contact plugs 33 and including a plurality of interconnects, and an interconnect layer 35 provided on the interconnect layer 34 and including a plurality of interconnects.

The circuit region 2 further includes an interconnect layer 36 provided on the interconnect layer 35 and including a plurality of interconnects, a plurality of via plugs 37 provided on the interconnect layer 36, and a plurality of metal pads 38 provided on these via plugs 37. The metal pads 38 are for example metal layers including Cu (copper) layers. The metal pads 38 are examples of the first pad (or the second pad). The circuit region 2 functions as a control circuit (logic circuit) that controls operation of the array region 1. The control circuit is configured with the transistors 31 and the like, and electrically connected to the metal pads 38.

The array region 1 includes a plurality of metal pads 41 provided on the metal pads 38, and a plurality of via plugs 42 provided on the metal pads 41. The array region 1 includes an interconnect layer 43 provided on these via plugs 42 and including a plurality of interconnects, and an interconnect layer 44 provided on the interconnect layer 43 and including a plurality of interconnects. The metal pads 41 are for example metal layers including Cu layers. The metal pads 41 are examples of the second pad (or the first pad). The bit line BL is included in the interconnect layer 44. The control circuit is electrically connected to the memory cell array 11 via the metal pads 41, 38 and the like and controls operation of the memory cell array 11 via the metal pads 41, 38 and the like.

The array region 1 further includes a plurality of via plugs 45 provided on the interconnect layer 44, a metal pad 46 provided on these via plugs 45 and the insulator 12, and a passivation film 47 provided on the metal pad 46 and the insulator 12. The metal pad 46 is for example a metal layer including a Cu layer, and functions as an external connection pad (bonding pad) of the semiconductor device in FIG. 1. The passivation film 47 is for example an insulator such as a silicon oxide film, and has an opening portion P that exposes an upper face of the metal pad 46. The metal pad 46 is connectible to a mounting substrate and other devices with a bonding wire, a solder ball, a metal bump and the like through the opening portion P.

Figure 2:
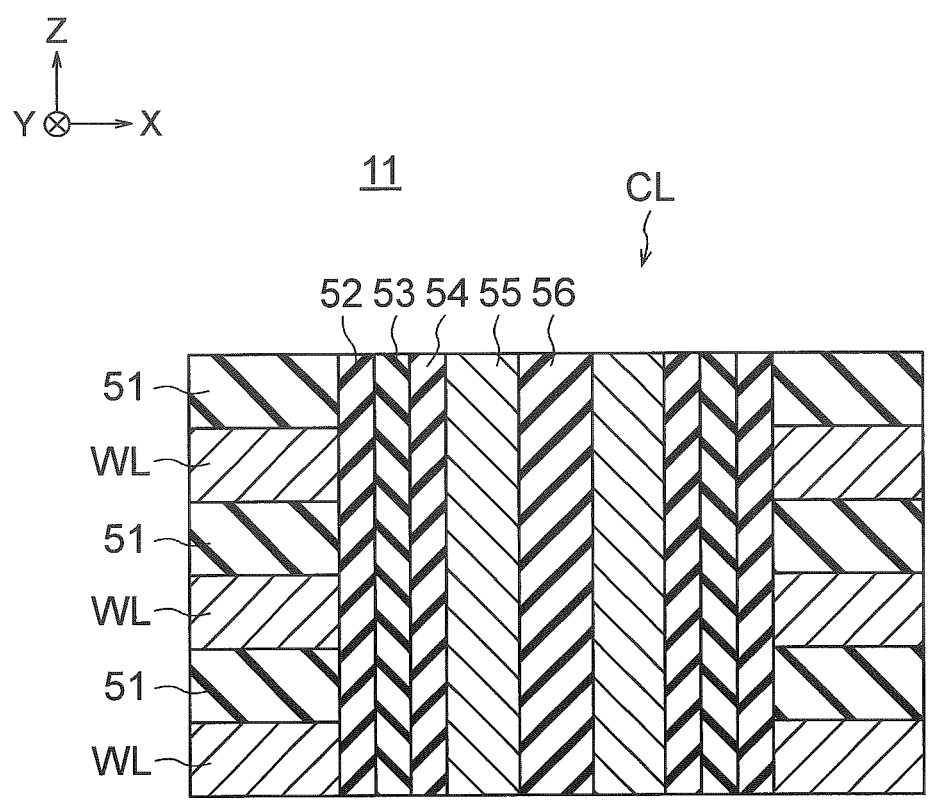
FIG. 2 is a cross-sectional view showing a structure of a columnar portion of the first embodiment.

FIG. 2 is a cross-sectional view showing a structure of the columnar portion CL of the first embodiment. FIG. 2 shows one of the plurality of columnar portions CL shown in FIG. 1.

As shown in FIG. 2, the memory cell array 11 includes the plurality of word lines WL and the plurality of insulating layers 51 alternately stacked on the inter layer dielectric 13 (FIG. 1). The word lines WL are for example W (tungsten) layers. The insulating layers 51 are for example silicon oxide films.

The columnar portion CL includes a block insulator 52, a charge storage layer 53, a tunnel insulator 54, a channel semiconductor layer 55, and a core insulator 56 in this order. The charge storage layer 53 is for example an insulator such as a silicon nitride film, and formed on a lateral face of the word lines WL and the insulating layers 51 via the block insulator 52. The charge storage layer 53 may also be a semiconductor layer such as a polysilicon layer. The channel semiconductor layer 55 is for example a polysilicon layer, and formed on a lateral face of the charge storage layer 53 via the tunnel insulator 54. The block insulator 52, the tunnel insulator 54, and the core insulator 56 are for example silicon oxide films or metal insulators.

Figure 3:
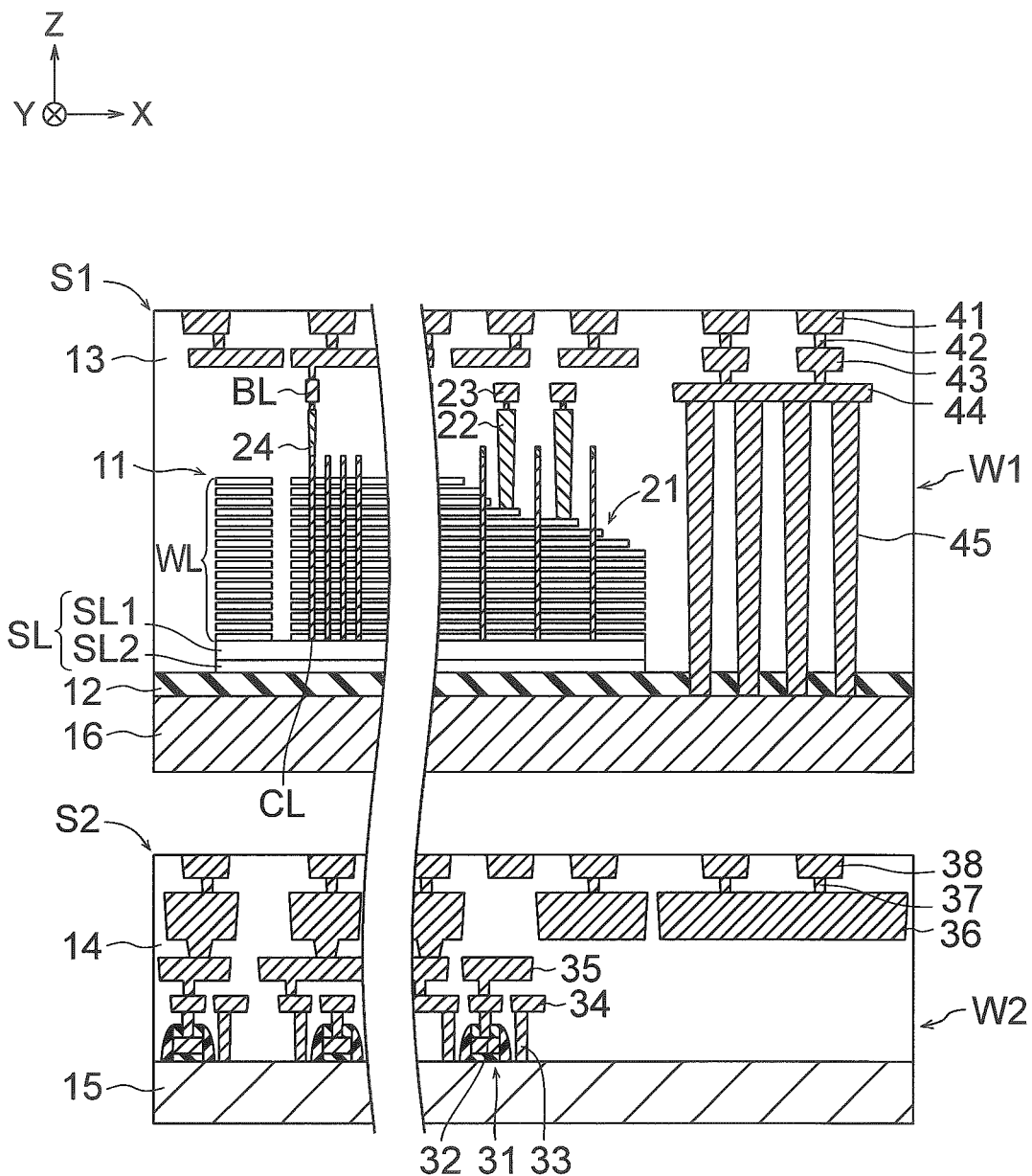
FIGS. 3 and 4 are cross-sectional views showing a method of manufacturing the semiconductor device of the first embodiment.
Figure 4:
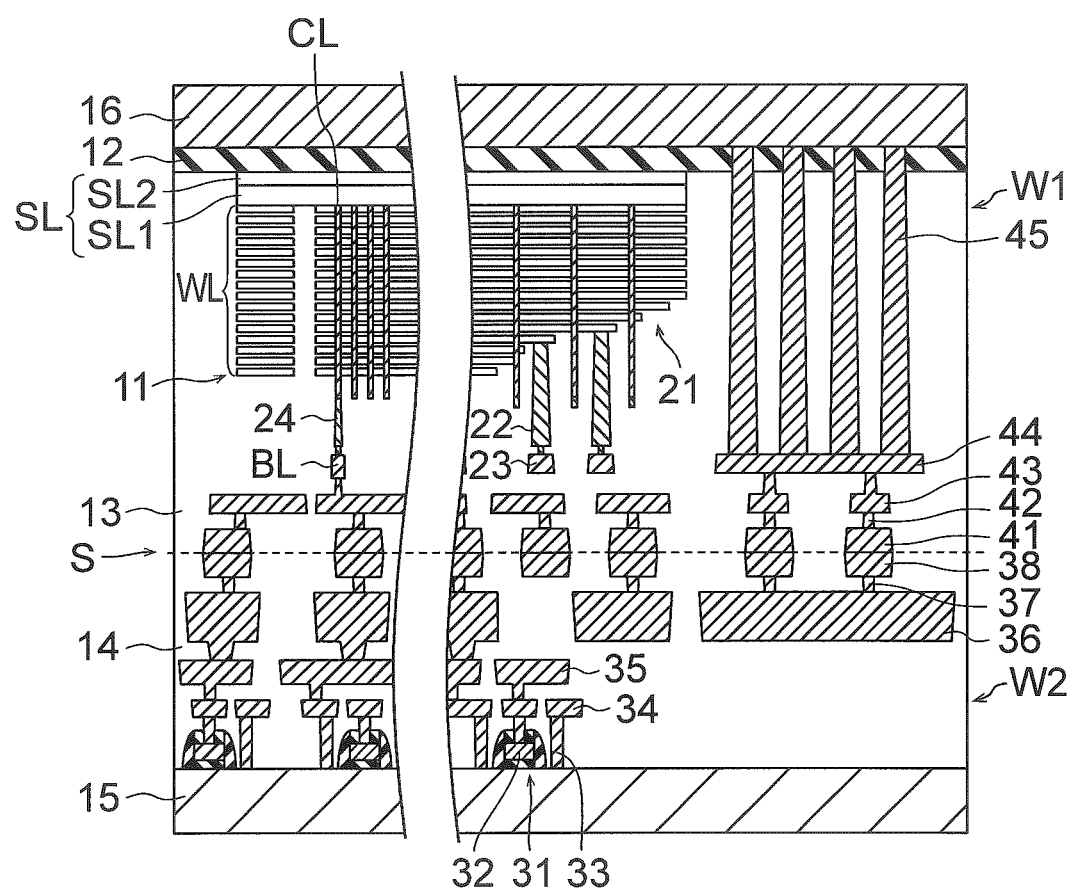

FIGS. 3 and 4 are cross-sectional views showing a method of manufacturing the semiconductor device of the first embodiment.

FIG. 3 shows an array wafer W1 including a plurality of array regions 1 and a circuit wafer W2 including a plurality of circuit regions 2. The array wafer W1 is also referred to as a "memory wafer" and the circuit wafer W2 is also referred to as a "CMOS wafer".

An orientation of the array wafer W1 in FIG. 3 is opposite to an orientation of the array region 1 in FIG. 1. In the present embodiment, the semiconductor device is manufactured by bonding the array wafer W1 to the circuit wafer W2. FIG. 3 shows the array wafer W1 before inversion of the orientation for bonding, and FIG. 1 shows the array region 1 after inversion of the orientation for bonding, bonding, and dicing.

In FIG. 3, a reference sign S1 denotes an upper face of the array wafer W1, and a reference sign S2 denotes an upper face of the circuit wafer W2. The array wafer W1 includes a substrate 16 provided under the insulator 12. The substrate 16 is for example a semiconductor substrate such as a silicon substrate. The substrate 15 is an example of the first substrate (or the second substrate), and the substrate 16 is an example of the second substrate (or the first substrate).

In the present embodiment, first, the memory cell array 11, the insulator 12, the inter layer dielectric 13, the stepped structure portion 21, the metal pads 41 and the like are formed on the substrate 16 of the array wafer W1, and the inter layer dielectric 14, the transistors 31, the metal pads 38 and the like are formed on the substrate 15 of the circuit wafer W2 as shown in FIG. 3. For example, the via plugs 45, the interconnect layer 44, the interconnect layer 43, the via plugs 42 and the metal pads 41 are formed in this order on the substrate 16. The contact plugs 33, the interconnect layer 34, the interconnect layer 35, the interconnect layer 36, the via plugs 37 and the metal pads 38 are formed in this order on the substrate 15. Next, the array wafer W1 is bonded to the circuit wafer W2 by mechanical pressure as shown in FIG. 4. As a result, the inter layer dielectric 13 and the inter layer dielectric 14 are joined. Next, the array wafer W1 and the circuit wafer W2 are annealed. As a result, the metal pads 41 and the metal pads 38 are joined.

Thereafter, the substrate 15 is thinned by CMP (Chemical Mechanical Polishing), the substrate 16 is removed by CMP, and then the array wafer W1 and the circuit wafer W2 are cut into a plurality of chips. As described above, the semiconductor device of FIG. 1 is manufactured. The metal pad 46 and the passivation film 47 are for example formed on the insulator 12 after thinning of the substrate 15 and removal of the substrate 16.

Although the array wafer W1 is bonded to the circuit wafer W2 in the present embodiment, the array wafer W1 may also be bonded to the array wafer W1 as an alternative. The description given above with reference to FIGS. 1 to 4 and the description given below with reference to FIGS. 5A to 33 may also be applied to bonding between array wafers W1.

Although FIG. 1 shows an interface between the inter layer dielectric 13 and the inter layer dielectric 14 and interfaces between the metal pads 41 and the metal pads 38, these interfaces typically become unobservable after the annealing. However, the positions at which these interfaces were present may be estimated by detecting, for example, inclination of lateral faces of the metal pads 41 and lateral faces of the metal pads 38, and positional shift between the lateral faces of the metal pads 41 and the metal pads 38.

Hereinafter, with reference to FIGS. 5A to 15B, further details of the semiconductor device of the present embodiment are described.

Figure 5A:
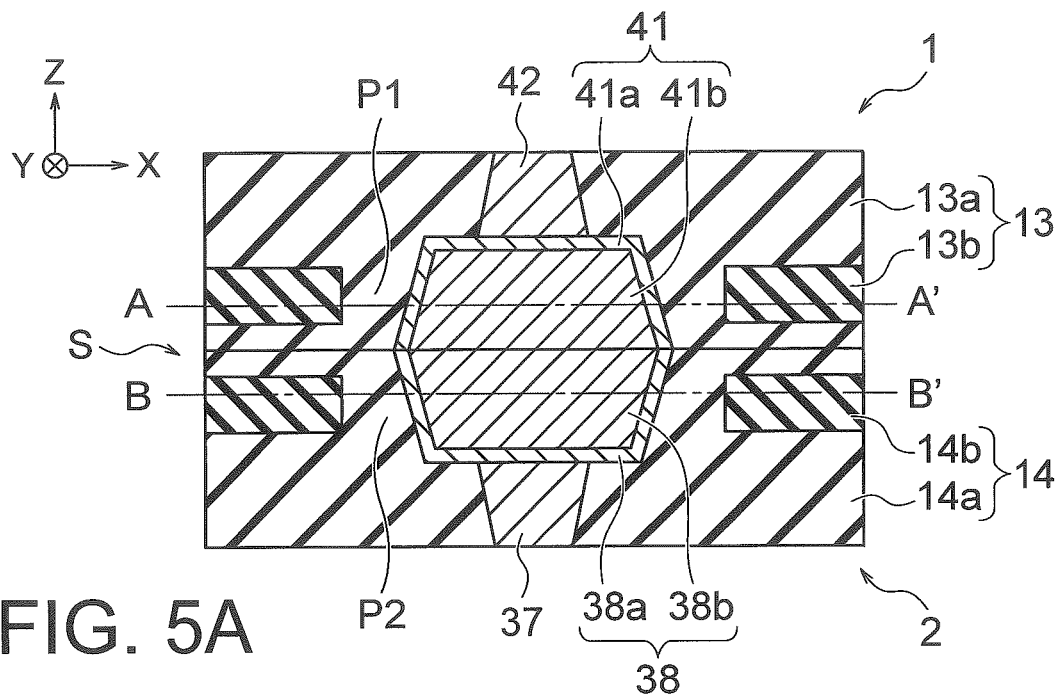
FIGS. 5A to 5C are cross-sectional views showing the structure of the semiconductor device of the first embodiment.
Figure 5B:
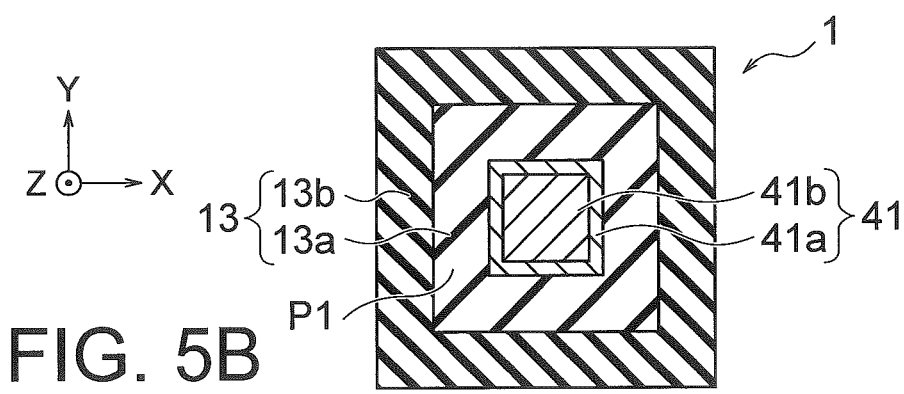
Figure 5C:
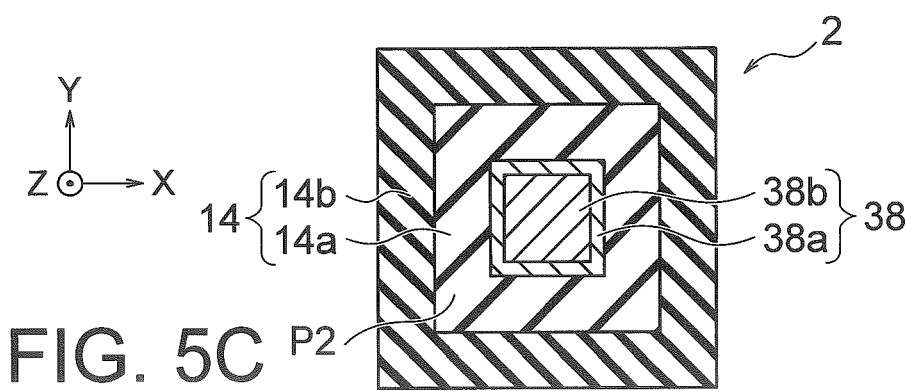

FIGS. 5A to 5C are cross-sectional views showing the structure of a semiconductor device of a first embodiment.

FIG. 5A is a vertical cross-sectional view showing one pair among a plurality of pairs of metal pads 38, 41 shown in FIG. 1. In FIG. 5A, the metal pad 38 is provided on the via plug 37 in the inter layer dielectric 14, and the metal pad 41 is provided under the via plug 42 in the inter layer dielectric 13. FIG. 5B is a lateral cross-sectional view taken along an A-A' line shown in FIG. 5A showing an X-Y cross section of the metal pad 41. FIG. 5C is a lateral cross-sectional view taken along a B-B' line shown in FIG. 5A showing an X-Y cross section of the metal pad 38.

Hereinafter, further details of the metal pads 38, 41 and the inter layer dielectrics 14, 13 shown in FIG. 5A are described. The description refers to FIGS. 5B and 5C as appropriate.

As shown in FIG. 5A, the metal pad 38 includes a barrier metal layer 38a and a pad material layer 38b. The barrier metal layer 38a is formed on a lateral face and an upper face of the inter layer dielectric 14, and the pad material layer 38b is formed in the inter layer dielectric 14 via the barrier metal layer 38a. Similarly, the metal pad 41 includes a barrier metal layer 41a and a pad material layer 41b. The barrier metal layer 41a is formed on a lateral face and a lower face of the inter layer dielectric 13, and the pad material layer 41b is formed in the inter layer dielectric 14 via the barrier metal layer 41a. The barrier metal layers 38a, 41a are for example metal layers containing a Ti (titanium) element or a Ta (tantalum) element. The pad material layers 38b, 41b are for example metal layers including Cu layers. Therefore, the metal pads 38, 41 are also referred to as "Cu pads".

The inter layer dielectric 14 of the present embodiment includes an insulator 14a and an insulator 14b. The insulator 14a is in contact with the metal pad 38 and the inter layer dielectric 13, and arranged in a lateral direction, a lower direction and the like of the metal pad 38. On the other hand, the insulator 14b is in contact with neither the metal pad 38 nor the inter layer dielectric 13, and arranged in a lateral direction of the metal pad 38. In other words, the insulator 14b is arranged at intervals from the metal pad 38 and the inter layer dielectric 13. In the present embodiment, since a thickness of the insulator 14b is smaller than a thickness of the metal pad 38, the insulator 14b is entirely positioned at the same height as a portion of the metal pad 38. Therefore, a B-B' line parallel to the XY plane passes through both the metal pad 38 and the insulator 14b. The insulator 14a is an example of the first film (or the second film), and the insulator 14b is an example of the second film (or the first film).

A reference for the "height" is for example the interface S. The reference for the "height" may also be the upper face of the substrate 15. This also applies to the term "height" used in the following.

The insulator 14a and the insulator 14b of the present embodiment are both $SiO_2$ films. Note that the insulator 14a of the present embodiment is formed by using for example dTEOS (densified tetraethyl orthosilicate). On the other hand, the insulator 14b of the present embodiment is formed by using for example PSZ (polysilazane). Therefore, the insulator 14b includes an N (nitrogen) atom as an impurity atom, and an N atom concentration in the insulator 14b is higher than an N atom concentration in the insulator 14a. Furthermore, the insulator 14b is shrunk in a thermal process during manufacture of the semiconductor device. During manufacture of the semiconductor device of the present embodiment, the metal pads 38 and the metal pads 41 may be suitably joined by leveraging such a characteristic of the insulator 14b as described later.

The insulator 14b of the present embodiment may also be another $SiO_2$ film (for example an NSG (None-doped Silicate Glass) film) that is shrunk in the thermal process during manufacture of the semiconductor device. The insulators 14a, 14b of the present embodiment may be other than the $SiO_2$ films.

The inter layer dielectric 13 of the present embodiment includes an insulator 13a and an insulator 13b. The insulator 13a is in contact with the metal pad 41 and the inter layer dielectric 14, and arranged in a lateral direction, an upper direction and the like of the metal pad 41. On the other hand, the insulator 13b is in contact with neither the metal pad 41 nor the inter layer dielectric 14, and arranged in a lateral direction of the metal pad 41. In other words, the insulator 13b is arranged at an interval from the metal pad 41 and the inter layer dielectric 14. In the present embodiment, since a thickness of the insulator 13b is smaller than a thickness of the metal pad 41, the insulator 13b is entirely positioned at the same height as a portion of the metal pad 41. Therefore, an A-A' line parallel to the XY plane passes through both the metal pad 41 and the insulator 13b. The insulator 13a is an example of the third film (or the fourth film), and the insulator 13b is an example of the fourth film (or the third film).

The insulator 13a and the insulator 13b of the present embodiment are both $SiO_2$ films. Note that the insulator 13a of the present embodiment is formed by using for example dTEOS. On the other hand, the insulator 13b of the present embodiment is formed by using for example PSZ. Therefore, the insulator 13b includes an N atom as an impurity atom, and an N atom concentration in the insulator 13b is higher than an N atom concentration in the insulator 13a. Furthermore, the insulator 13b is shrunk in a thermal process during manufacture of the semiconductor device. During manufacture of the semiconductor device of the present embodiment, the metal pads 38 and the metal pads 41 may be suitably joined by leveraging such a characteristic of the insulator 13b as described later.

The insulator 13b of the present embodiment may also be another $SiO_2$ film (for example an NSG film) that is shrunk in the thermal process during manufacture of the semiconductor device. The insulators 13a, 13b of the present embodiment may be other than the $SiO_2$ films.

The insulator 13a of the present embodiment includes a portion P1 provided between the lateral face of the metal pad 41 and a lateral face of the insulator 13b as shown in FIG. 5A. Therefore, the insulator 13b is not in contact with the metal pad 41. The portion P1 is an example of the second portion (or the first portion). Similarly, the insulator 14a of the present embodiment includes a portion P2 provided between the lateral face of the metal pad 38 and a lateral face of the insulator 14b. Therefore, the insulator 14b is not in contact with the metal pad 38. The portion P2 is an example of the first portion (or the second portion).

FIG. 5B shows an X-Y cross section of the portion P1 of the insulator 13a. The portion P1 of the present embodiment has a circular planar shape surrounding the metal pad 41 as shown in FIG. 5B. The portion P1 is further surrounded in a circular shape by the insulator 13b.

FIG. 5C shows an X-Y cross section of the portion P2 of the insulator 14a. The portion P2 of the present embodiment has a circular planar shape surrounding the metal pad 38 as shown in FIG. 5C. The portion P2 is further surrounded in a circular shape by the insulator 14b.

Figure 6A:
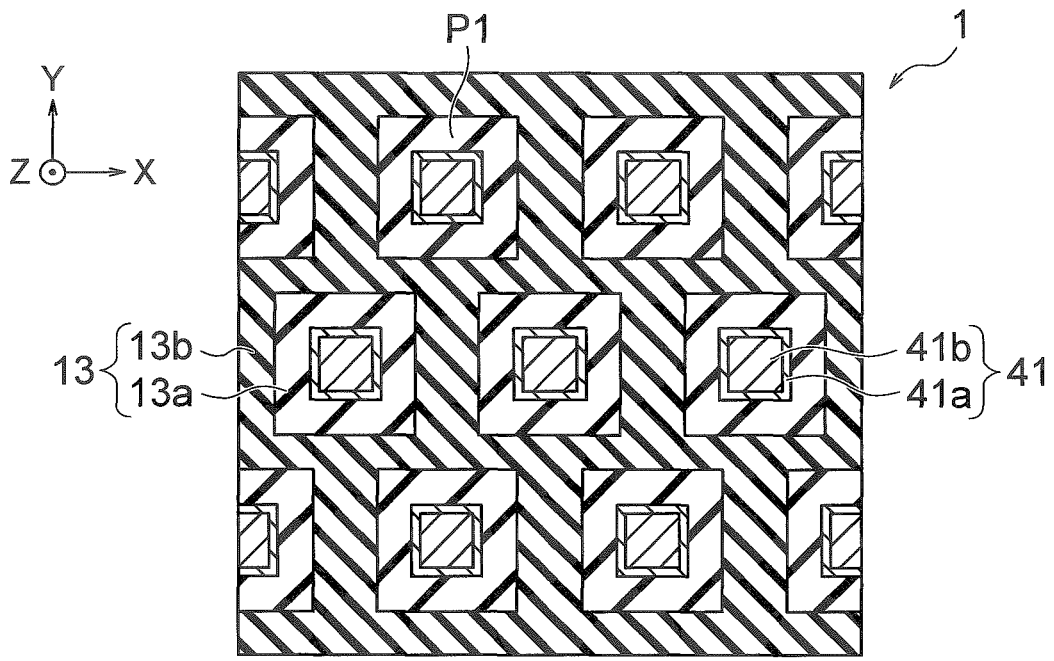
FIGS. 6A to 6B are cross-sectional views showing two examples of the structure of the semiconductor device of the first embodiment.
Figure 6B:
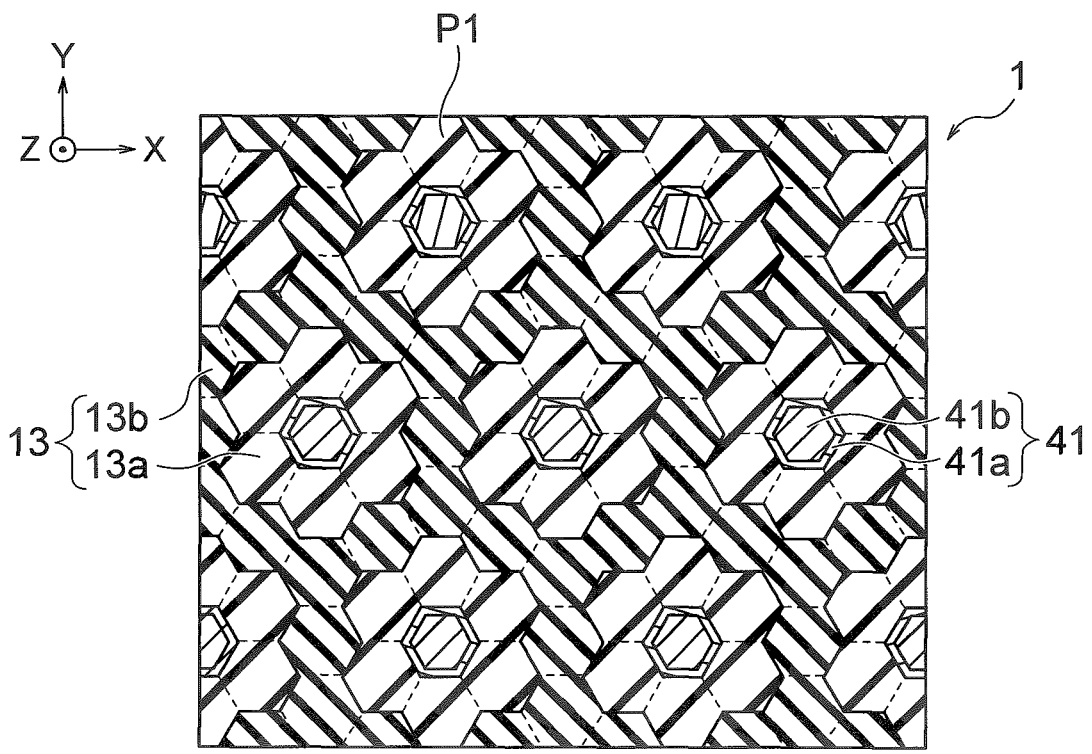

FIGS. 6A to 6B are cross-sectional views showing two examples of the structure of the semiconductor device of the first embodiment.

FIG. 6A shows a first example of the structure of the semiconductor device of the present embodiment. FIG. 6A is a lateral cross-sectional view showing a broader range than FIG. 5B. In this example, each metal pad 41 has a solid rectangular planar shape, and the portion P1 surrounding each metal pad 41 has a hollow rectangular planar shape. In this example, one insulator 13b surrounds the plurality of metal pads 41 individually via the plurality of portions P1.

FIG. 6B shows a second example of the structure of the semiconductor device of the present embodiment. FIG. 6B is, similarly to FIG. 6A, a lateral cross-sectional view showing a broader range than FIG. 5B, showing a different structure from the structure shown in FIG. 6A. In this example, each metal pad 41 has a solid hexagonal planar shape, and the portion P1 surrounding each metal pad 41 has a hollow and substantially hexagonal planar shape. Specifically, each portion P1 has a circular planar shape which is a combination of a plurality (six in this example) of hexagons, each of these hexagons being in the same size as one metal pad 41. Similarly, the insulator 13b also has a circular planar shape which is a combination of a plurality of hexagons, each of these hexagons being in the same size as one metal pad 41. As described above, the planar shapes of the metal pad 41, the portion P1, and the insulator 13b of this example are in a honeycomb structure. In this example as well, one insulator 13b surrounds the plurality of metal pads 41 individually via the plurality of portions P1.

The planar shapes of the metal pad 38, the portion P2, and the insulator 14b in the first example are the same as the planar shapes of the metal pad 41, the portion P1, and the insulator 13b respectively. The planar shapes of the metal pad 38, the portion P2, and the insulator 14b in the second example are the same as the planar shapes of the metal pad 41, the portion P1, and the insulator 13b respectively.

Figure 7A:
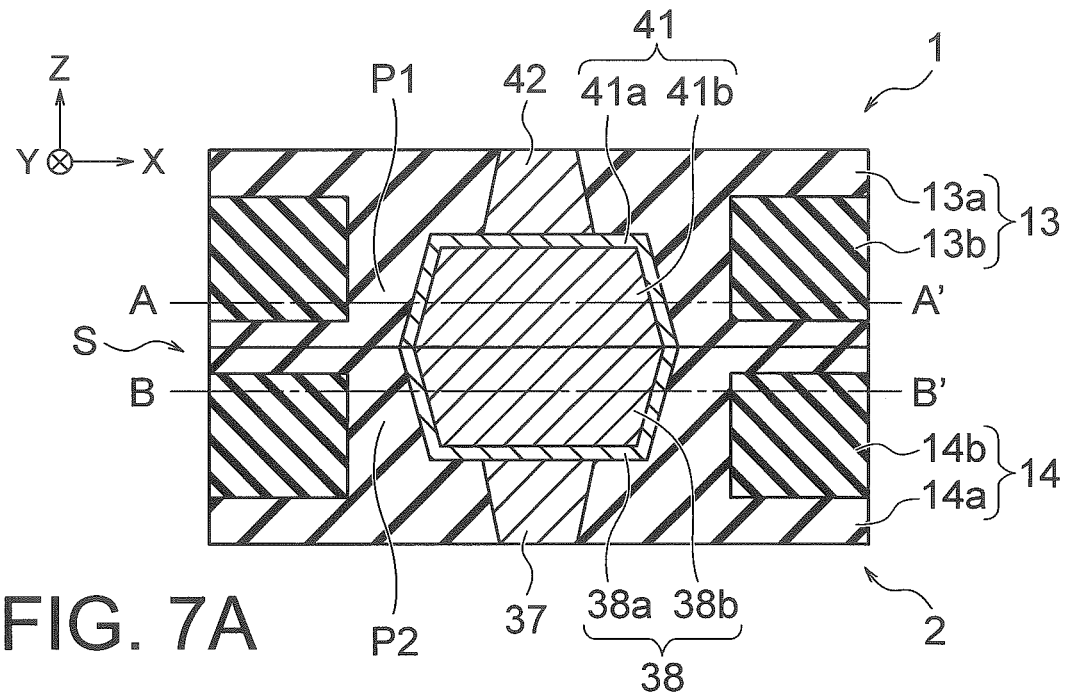
FIGS. 7A to 7C are cross-sectional views showing a structure of a semiconductor device of a first modification of the first embodiment.
Figure 7B:
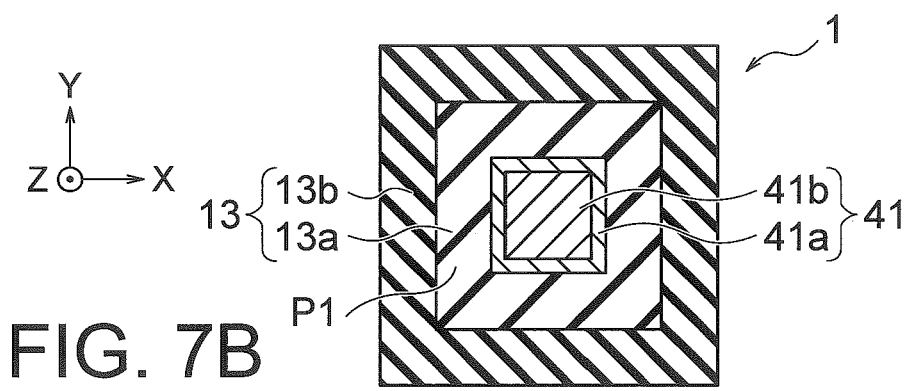
Figure 7C:
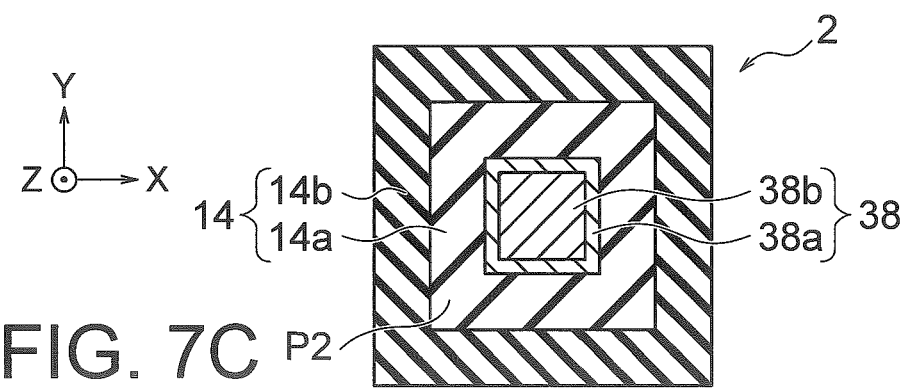

FIGS. 7A to 7C are cross-sectional views showing a structure of a semiconductor device of a first modification of the first embodiment. FIGS. 7A to 7C correspond to FIGS. 5A to 5C, respectively.

The insulator 14b of the present modification is, similarly to that of the first embodiment, not in contact with the metal pad 38 and the inter layer dielectric 13, and arranged in a lateral direction and the like of the metal pad 38. Similarly, the insulator 13b of the present modification is not in contact with the metal pad 41 nor the inter layer dielectric 14, and arranged in a lateral direction and the like of the metal pad 41.

However, a thickness of the insulator 14b of the present modification is greater than a thickness of the metal pad 38, and the insulator 14b is only partially positioned at the same height as a portion of the metal pad 38. Therefore, the insulator 14b of the present modification includes, not only a portion at a higher position than a lower face of the metal pad 38, but also a portion at a lower position than the lower face of the metal pad 38. Similarly, a thickness of the insulator 13b of the present modification is greater than a thickness of the metal pad 41, and the insulator 13b is only partially positioned at the same height as a portion of the metal pad 41. Therefore, the insulator 13b of the present modification includes, not only a portion at a lower position than an upper face of the metal pad 41, but also a portion at a higher position than the upper face of the metal pad 41. According to the present modification, due to the insulators 14b, 13b having such shapes, the metal pads 38 and the metal pads 41 may be suitably joined.

The thickness of the insulator 14b of the present modification may be smaller than the thickness of the metal pad 38, and the thickness of the insulator 13b of the present modification may be smaller than the thickness of the metal pad 41.

Figure 8A:
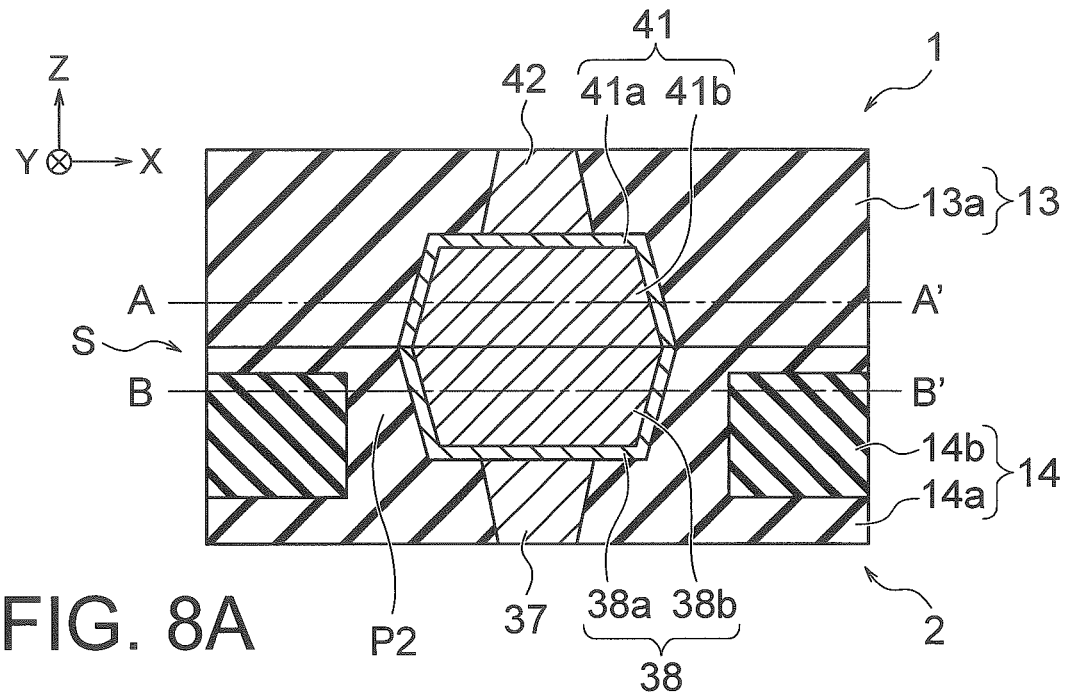
FIGS. 8A to 8C are cross-sectional views showing a structure of a semiconductor device of a second modification of the first embodiment.
Figure 8B:
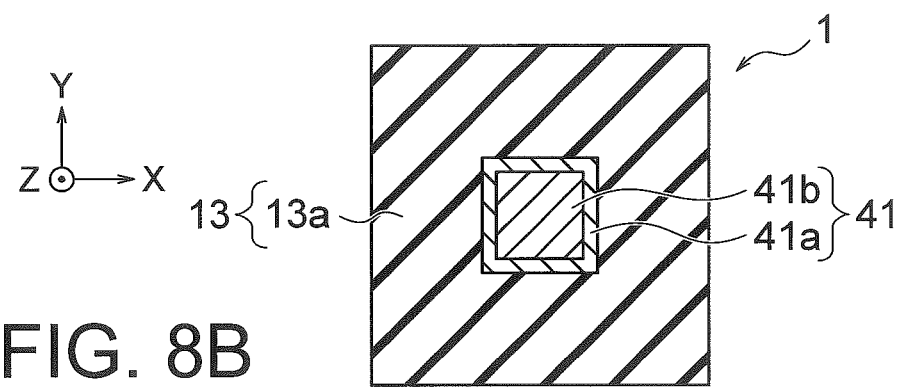
Figure 8C:
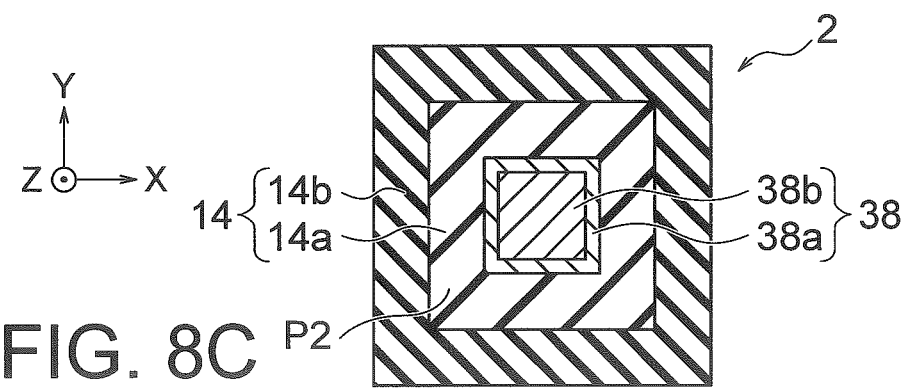

FIGS. 8A to 8C are cross-sectional views showing a structure of a semiconductor device of a second modification of the first embodiment. FIGS. 8A to 8C correspond to FIGS. 5A to 5C, respectively.

The inter layer dielectric 14 of the present modification includes insulators 14a, 14b having the same shapes as the insulators 14a, 14b of the first modification. On the other hand, the inter layer dielectric 13 of the present modification includes the insulator 13a but not the insulator 13b. According to the present modification, due to the insulator 14b having such a shape, the metal pads 38 and the metal pads 41 may be suitably joined.

Figure 9A:
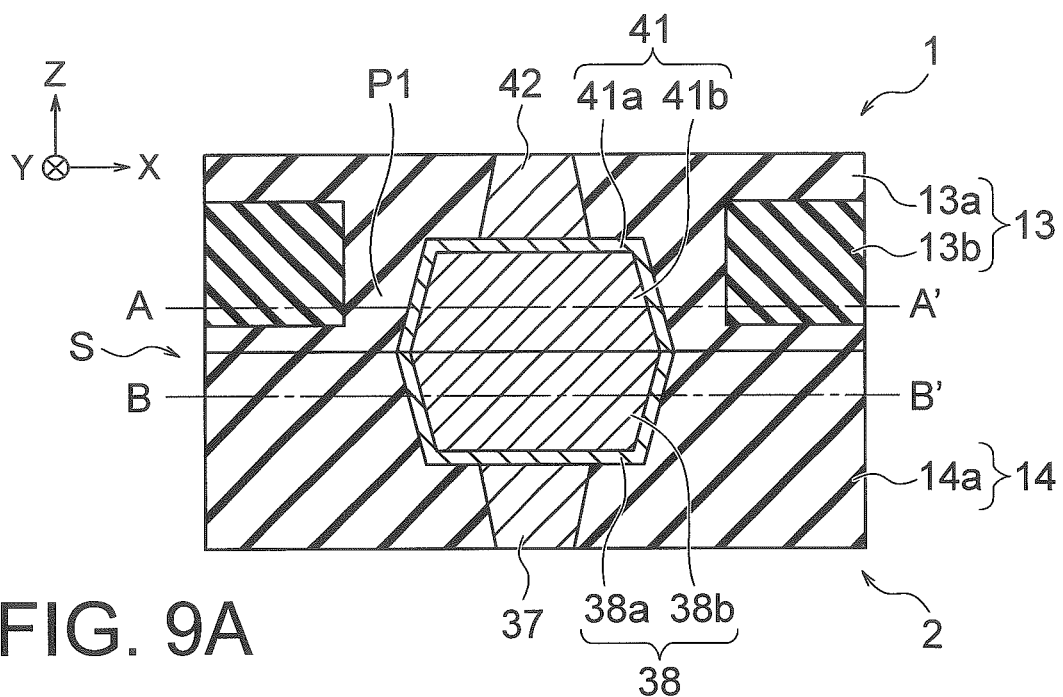
FIGS. 9A to 9C are cross-sectional views showing a structure of a semiconductor device of a third modification of the first embodiment.
Figure 9B:
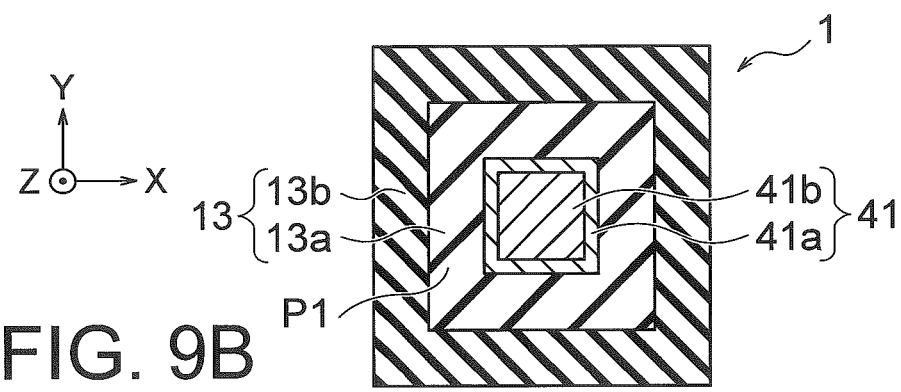
Figure 9C:
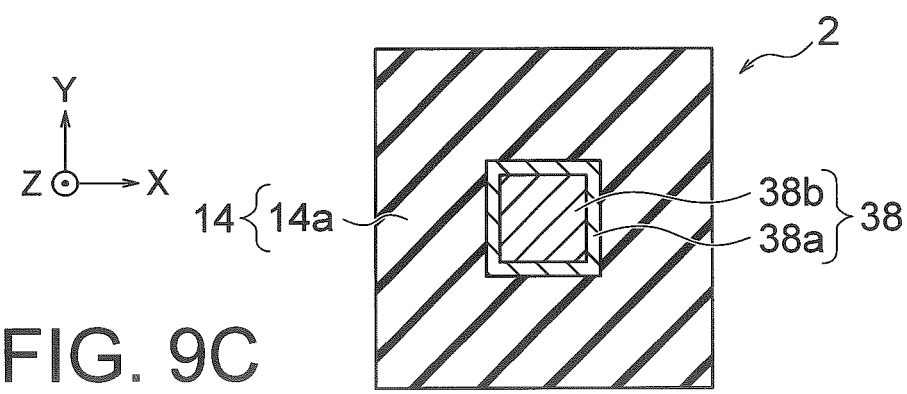

FIGS. 9A to 9C are cross-sectional views showing a structure of a semiconductor device of a third modification of the first embodiment. FIGS. 9A to 9C correspond to FIGS. 5A to 5C, respectively.

The inter layer dielectric 13 of the present modification includes insulators 13a, 13b having the same shapes as the insulators 13a, 13b of the first modification. On the other hand, the inter layer dielectric 14 of the present modification includes the insulator 14a but not the insulator 14b. According to the present modification, due to the insulator 13b having such a shape, the metal pads 38 and the metal pads 41 may be suitably joined.

FIGS. 10A to 10C are cross-sectional views showing an outline of the method of manufacturing the semiconductor device of the first embodiment. FIGS. 10A to 10C show details of the method shown in FIGS. 3 and 4.

FIG. 10A shows the array region 1 (array wafer W1) before bonding to the circuit region 2 (circuit wafer W2). In FIG. 10A, the upper face of the metal pad 38 is recessed in a lower direction with respect to the upper face of the inter layer dielectric 14, and the lower face of the metal pad 41 is recessed in an upper direction with respect to the lower face of the inter layer dielectric 13. These recesses are referred to as dishing, and generated during, for example, flattening of the surfaces of the inter layer dielectrics 14, 13 by CMP. Even when the array region 1 is bonded to the circuit region 2, the metal pads 41 and the metal pads 38 may not be suitably joined due to these recesses.

FIG. 10B shows the array region 1 after bonding to the circuit region 2 and before annealing for joining the metal pads 38, 41. In FIG. 10B, a gap is caused between the metal pad 41 and the metal pad 38 due to the aforementioned recesses. Without filling the gap, joining defect between the metal pads 41 and the metal pads 38 is likely.

FIG. 10C shows the array region 1 after bonding to the circuit region 2 and after annealing for joining the metal pads 38, 41. In FIG. 10C, the gap between the metal pad 41 and the metal pad 38 is filled and the metal pad 41 and the metal pad 38 are suitably joined. This is due to thermal expansion of the metal pads 41, 38 by the annealing, and action of the insulators 14b, 13b by the annealing.

The action of the insulators 14b, 13b of the present embodiment is described hereinafter.

The insulators 14b, 13b of the present embodiment are formed by using for example PSZ (polysilazane). Therefore, during annealing of the metal pads 41, 38, the insulators 14b, 13b are heated and shrunk. As a result, a compressive stress is applied from the insulators 14b, 13b to the metal pads 41, 38, and facilitates approach between the metal pad 41 and the metal pad 38. Therefore, according to the present embodiment, due to the thermal expansion of the metal pads 41, 38 and the action of the insulators 14b, 13b, it is made possible to suitably join the metal pads 41 and the metal pads 38.

A thickness of the insulator 14b of the present embodiment is reduced by, for example, greater than 9% and no greater than 25% by the shrinkage during the annealing. When the thickness of the insulator 14b before the shrinkage is denoted by "T1" and the thickness of the insulator 14b after the shrinkage is denoted by "T2", a relationship $T1 \times 0.75 \leq T2 < T1 \times 0.91$ is satisfied. Similarly, a thickness of the insulator 13b of the present embodiment is reduced by, for example, greater than 9% and no greater than 25% by the shrinkage during the annealing. This makes it possible to generate a sufficient compressive stress and to sufficiently suitably join the metal pad 41 and the metal pad 38.

The metal pads 41, 38 of the present embodiment include for example Cu layers. Therefore, the annealing of the metal pads 41, 38 is preferably carried out at no greater than 400° C. in order to suppress a negative influence of the annealing to the Cu layers. Therefore, the thickness of the insulator 14b of the present embodiment is preferably reduced by greater than 9% and no greater than 25% by the annealing at no greater than 400° C. Such an insulator 14b can be realized by, for example, forming the insulator 14b by using PSZ. This also applies to the insulator 13b.

The inter layer dielectric 14 of the present embodiment preferably includes not only the insulator 14b formed by using PSZ and the like, but also the insulator 14a formed by using dTEOS and the like. This is because, immediately after forming a PSZ film on the substrate 15, the PSZ film has a characteristic close to liquid and a process (for example, CPM) of the PSZ film is difficult.

FIGS. 11A to 15B are cross-sectional views showing details of the method of manufacturing the semiconductor device of the first embodiment. FIGS. 11A to 15B show details of the method shown in FIGS. 10A to 10C.

FIG. 11A shows a portion of the circuit region 2 (circuit wafer W2). When forming the circuit region 2, an insulator 14a1 is formed on an upper side of the substrate 15, the via plug 37 is formed in the insulator 14a1, and an insulator 14a2 is formed on the insulator 14a1 and the via plug 37 (FIG. 11A). The insulators 14a1, 14a2 are parts of the insulator 14a, and formed by, for example, CVD (Chemical Vapor Deposition) by using dTEOS as a source gas.

Next, a concave portion H1 is formed in the insulator 14a2 by lithography and RIE (Reactive Ion Etching) (FIG. 11B). Next, the insulator 14b is formed in the concave portion H1 (FIG. 12A). The insulator 14b is formed by, for example, a coating method using PSZ. The insulator 14b of the present embodiment may be formed to have, for example, either a planar shape shown in FIG. 5C and FIG. 6A or a planar shape shown in FIG. 6B.

Next, the insulator 14a3 is formed on the insulators 14a2, 14b (FIG. 12B). The insulator 14a3 is a portion of the insulator 14a, and formed by, for example, CVD by using dTEOS. Next, a concave portion H2 is formed in the insulators 14a2, 14a3 by lithography and RIE (FIG. 13A). As a result, an upper face of the via plug 37 is exposed in the concave portion H2. The concave portion H2 is used as a pad groove in which the metal pad 38 is to be embedded.

Next, a barrier metal layer 38a is formed on the via plug 37 and the insulators 14a1, 14a2, 14a3 (FIG. 13B). The barrier metal layer 38a is for example a metal layer containing a Ti element or a Ta element, and is formed by CVD.

Next, the pad material layer 38b is formed on the via plug 37 and the insulators 14a1, 14a2, 14a3, via the barrier metal layer 38a (FIG. 14A). The pad material layer 38b is for example a Cu layer and formed by a plating method.

Next, the surface of the pad material layer 38b is flattened by CMP (FIG. 14B). As a result, the barrier metal layer 38a and the pad material layer 38b outside the concave portion H2 are removed, and the metal pad 38 is formed in the concave portion H2. The metal pad 38 of the present embodiment is formed in a position in contact with the insulators 14a1, 14a2, 14a3, and not in contact with the insulator 14b. In FIG. 14B, a thickness of the insulator 14b is smaller than a thickness of the metal pad 38, and the insulator 13b is entirely positioned at the same height as a portion of the metal pad 38.

FIG. 15A shows a portion of the array region 1 (array wafer W1). The array region 1 shown in FIG. 15A is formed by the steps shown in FIGS. 11A to 14B, similarly to the circuit region 2. However, the substrate 16, the insulators 13a1, 13a2, 13a3 in the insulator 13a, the insulator 13b, the via plug 42, the barrier metal layer 41a, the pad material layer 41b and the like are respectively processed similarly to the substrate 15, the insulators 14a1, 14a2, 14a3 in the insulator 14a, the insulator 14b, the via plug 37, the barrier metal layer 38a, the pad material layer 38b and the like.

Next, the substrate 15 is bonded to the substrate 16 such that the metal pads 41 are arranged on the metal pads 38, and the insulator 13a1 (inter layer dielectric 13) is arranged on the insulator 14a1 (inter layer dielectric 14) (FIG. 15B). Specifically, by bonding the inter layer dielectric 14 to the inter layer dielectric 13 by mechanical pressure, the inter layer dielectric 14 and the inter layer dielectric 13 are joined. Furthermore, by annealing the metal pads 38, 41, the inter layer dielectrics 14, 13 and the like, the metal pads 41 and the metal pads 38 are joined. By the shrinkage of the insulators 14b, 13b during this annealing, joining of the metal pads 38, 41 can be promoted.

Thereafter, the substrate 15 is thinned by CMP, the substrate 16 is removed by CMP, and then the array wafer W1 and the circuit wafer W2 (see FIG. 4) are cut into a plurality of chips. As described above, the semiconductor device of the present embodiment shown in FIGS. 5A to 5C and the like is manufactured.

The insulators 14b, 13b formed by the method shown in FIGS. 11A to 15B may have the shape of any one of the first to third modifications of the present embodiment. The shape of the insulator 14b can be controlled by adjusting the shape of the concave portion H1. Similarly, the shape of the insulator 13b can also be controlled by adjusting the shape of a concave portion corresponding to the concave portion H1.

As described above, the semiconductor device of the present embodiment includes the inter layer dielectric 14 including not only the insulator 14a but also the insulator 14b, and the inter layer dielectric 13 including not only the insulator 13a but also the insulator 13b. The insulators 14a, 13a are formed by using dTEOS for example. The insulators 14b, 13b are formed by using PSZ for example. Therefore, according to the present embodiment, due to the action of the insulators 14b, 13b, it is made possible to suitably join the metal pads 38 and the metal pads 41.

Second Embodiment

Figure 16:
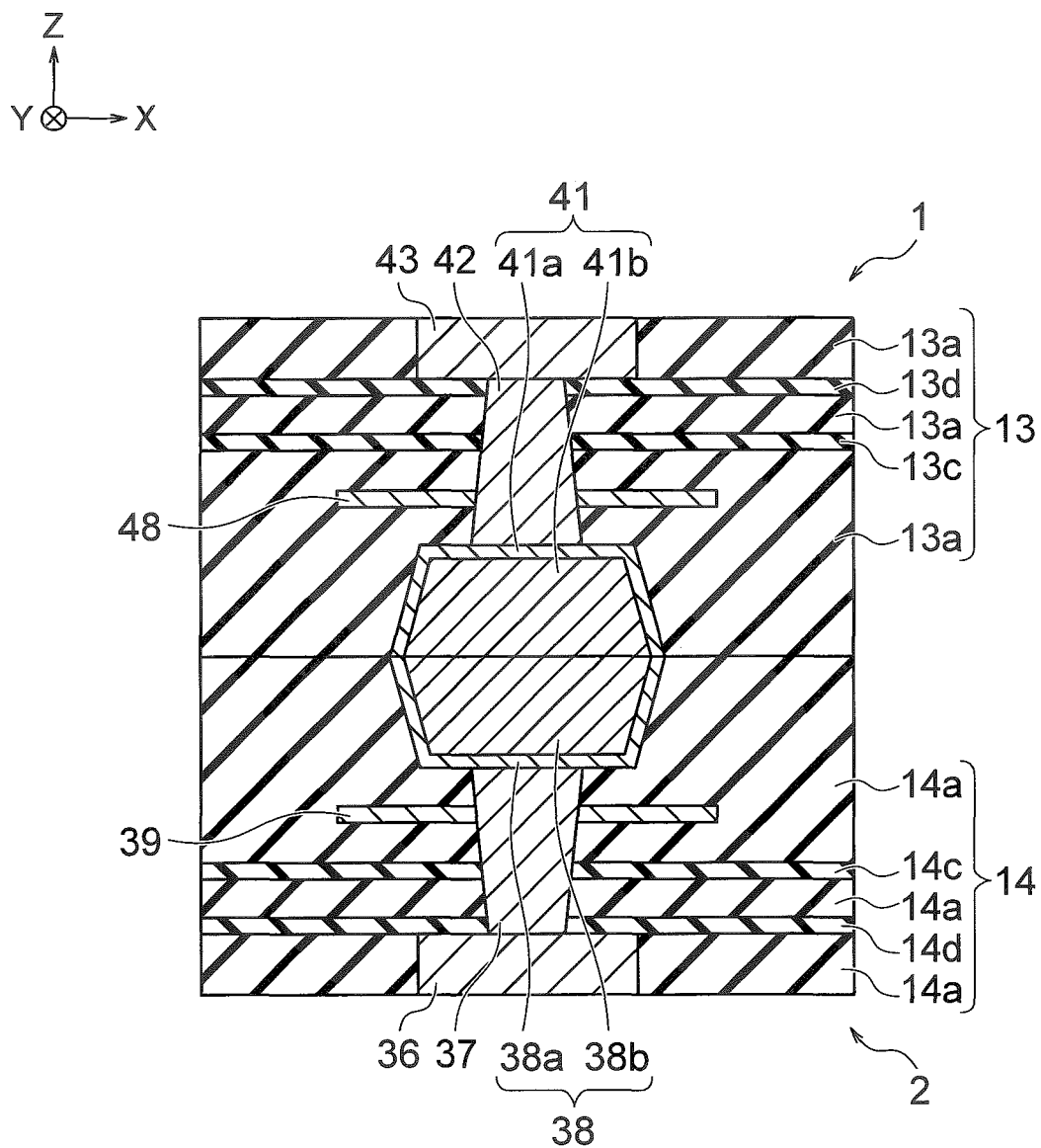
FIG. 16 is a cross-sectional view showing a structure of a semiconductor device of a second embodiment.

FIG. 16 is a cross-sectional view showing a structure of a semiconductor device of the second embodiment.

Similarly to FIG. 5A, FIG. 16 is a vertical cross-sectional view showing one pair among a plurality of pairs of metal pads 38, 41 shown in FIG. 1. In FIG. 16, the metal pad 38 is provided on the via plug 37 in the inter layer dielectric 14, and the metal pad 41 is provided under the via plug 42 in the inter layer dielectric 13. Furthermore, the via plug 37 is provided on the interconnect layer 36 in the inter layer dielectric 14, and the via plug 42 is provided under the interconnect layer 43 in the inter layer dielectric 13.

Hereinafter, further details of the metal pads 38, 41 and the inter layer dielectrics 14, 13 shown in FIG. 16 are described. In the description, as for aspects in common with the metal pads 38, 41 and the inter layer dielectrics 14, 13 shown in FIG. 5A, description is omitted as appropriate.

The inter layer dielectric 14 of the present embodiment includes a plurality of insulators 14a, an insulator 14c, and an insulator 14d as illustrated in FIG. 16. Each of the insulators 14a is an $SiO_2$ film formed by using dTEOS for example. The insulator 14c is provided in a lateral direction of the via plug 37 and interposed between two insulators 14a. The insulator 14c is for example an SiCN film (silicon carbonitride film). The insulator 14d is provided on an upper face of the interconnect layer 36 and interposed between two insulators 14a. The insulator 14d is for example a SiN film.

Similarly, the inter layer dielectric 13 of the present embodiment includes a plurality of insulators 13a, an insulator 13c, and an insulator 13d. Each of the insulators 13a is an $SiO_2$ film formed by using dTEOS for example. The insulator 13c is provided in a lateral direction of the via plug 42 and interposed between two insulators 13a. The insulator 13c is for example an SiCN film. The insulator 13d is provided on a lower face of the interconnect layer 43 and interposed between two insulators 13a. The insulator 13d is for example a SiN film.

The semiconductor device of the present embodiment further includes a metal layer 39 provided in the uppermost insulator 14a. The metal layer 39 is positioned in a lateral direction of the via plug 37 and in contact with the via plug 37. In addition, the metal layer 39 is positioned in a lower direction of the metal pad 38 and in an upper direction of the interconnect layer 36, and in contact with neither the metal pad 38 nor the interconnect layer 36. In other words, the metal layer 39 is arranged at an interval from the metal pad 38 and the interconnect layer 36. The metal layer 39 of the present embodiment has a circular planar shape surrounding the via plug 37. The metal layer 39 is an example of the first layer (or the second layer) and the first metal layer (or the second metal layer).

In the present embodiment, since a thickness of the metal layer 39 is smaller than a thickness of the via plug 37, the metal layer 39 is entirely positioned at the same height as a portion of the via plug 37. Therefore, an upper face of the metal layer 39 is positioned at a height lower than the upper face of the via plug 37, and a lower face of the metal layer 39 is positioned at a height higher than a lower face of the via plug 37. In addition, the thickness of the metal layer 39 of the present embodiment is smaller than the thickness of the metal pad 38, and for example no less than 5% and no greater than 30% of the thickness of the metal pad 38. When the thickness of the metal pad 38 is denoted by "T3" and the thickness of the metal layer 39 is denoted by "T4", a relationship $T3 \times 0.05 \leq T4 \leq T3 \times 0.30$ is satisfied.

The metal layer 39 of the present embodiment has a linear expansion coefficient greater than a linear expansion coefficient of the pad material layer 38b of the metal pad 38. Therefore, in the thermal process during manufacture of the semiconductor device, a thermal expansion rate of the metal layer 39 is greater than a thermal expansion rate of the pad material layer 38b. During manufacture of the semiconductor device of the present embodiment, the metal pads 38 and the metal pads 41 may be suitably joined by leveraging such a characteristic of the metal layer 39 as described later. For example, the pad material layer 38b is a Cu (copper) layer, and the metal layer 39 is an Al (aluminum) layer or a Zn (zinc) layer. At the same temperature, aluminum and zinc have linear expansion coefficients greater than that of copper. For example, the linear expansion coefficients at 20° C. of copper, aluminum, and zinc are $16.5 \times 10^{-6}/°$ C., $23.1 \times 10^{-6}/°$ C., and $30.2 \times 10^{-6}/°$ C. respectively. Further detail of the linear expansion coefficient is described later.

The semiconductor device of the present embodiment further includes a metal layer 48 provided in the lowermost insulator 13a. The metal layer 48 is positioned in a lateral direction of the via plug 42 and in contact with the via plug 42. In addition, the metal layer 48 is positioned in an upper direction of the metal pad 41 and in a lower direction of the interconnect layer 43, and in contact with neither the metal pad 41 nor the interconnect layer 43. In other words, the metal layer 48 is arranged at an interval from the metal pad 41 and the interconnect layer 43. The metal layer 48 of the present embodiment has a circular planar shape surrounding the via plug 42. The metal layer 48 is an example of the second layer (or the first layer) and the second metal layer (or the first metal layer).

In the present embodiment, since a thickness of the metal layer 48 is smaller than a thickness of the via plug 42, the metal layer 48 is entirely positioned at the same height as a portion of the via plug 42. Therefore, a lower face of the metal layer 48 is positioned at a height higher than the lower face of the via plug 42, and an upper face of the metal layer 48 is positioned at a height lower than an upper face of the via plug 42. In addition, the thickness of the metal layer 48 of the present embodiment is smaller than the thickness of the metal pad 41, and for example no less than 5% and no greater than 30% of the thickness of the metal pad 41.

The metal layer 48 of the present embodiment has a linear expansion coefficient greater than a linear expansion coefficient of the pad material layer 41b of the metal pad 41. Therefore, in the thermal process during manufacture of the semiconductor device, a thermal expansion rate of the metal layer 48 is greater than a thermal expansion rate of the pad material layer 41b. During manufacture of the semiconductor device of the present embodiment, the metal pads 38 and the metal pads 41 may be suitably joined by leveraging such a characteristic of the metal layer 48 as described later. For example, the pad material layer 41b is a Cu layer, and the metal layer 48 is an Al layer or a Zn layer.

The semiconductor device of the present embodiment may include a non-metal layer having a linear expansion coefficient greater than that of the pad material layer 38b instead of the metal layer 39, and may include a non-metal layer having a linear expansion coefficient greater than that of the pad material layer 41b instead of the metal layer 48. In this case, the metal pads 38 and the metal pads 41 may be suitably joined by leveraging such characteristics of the non-metal layers. These non-metal layers may be formed from either an inorganic substance or an organic substance.

Figure 17:
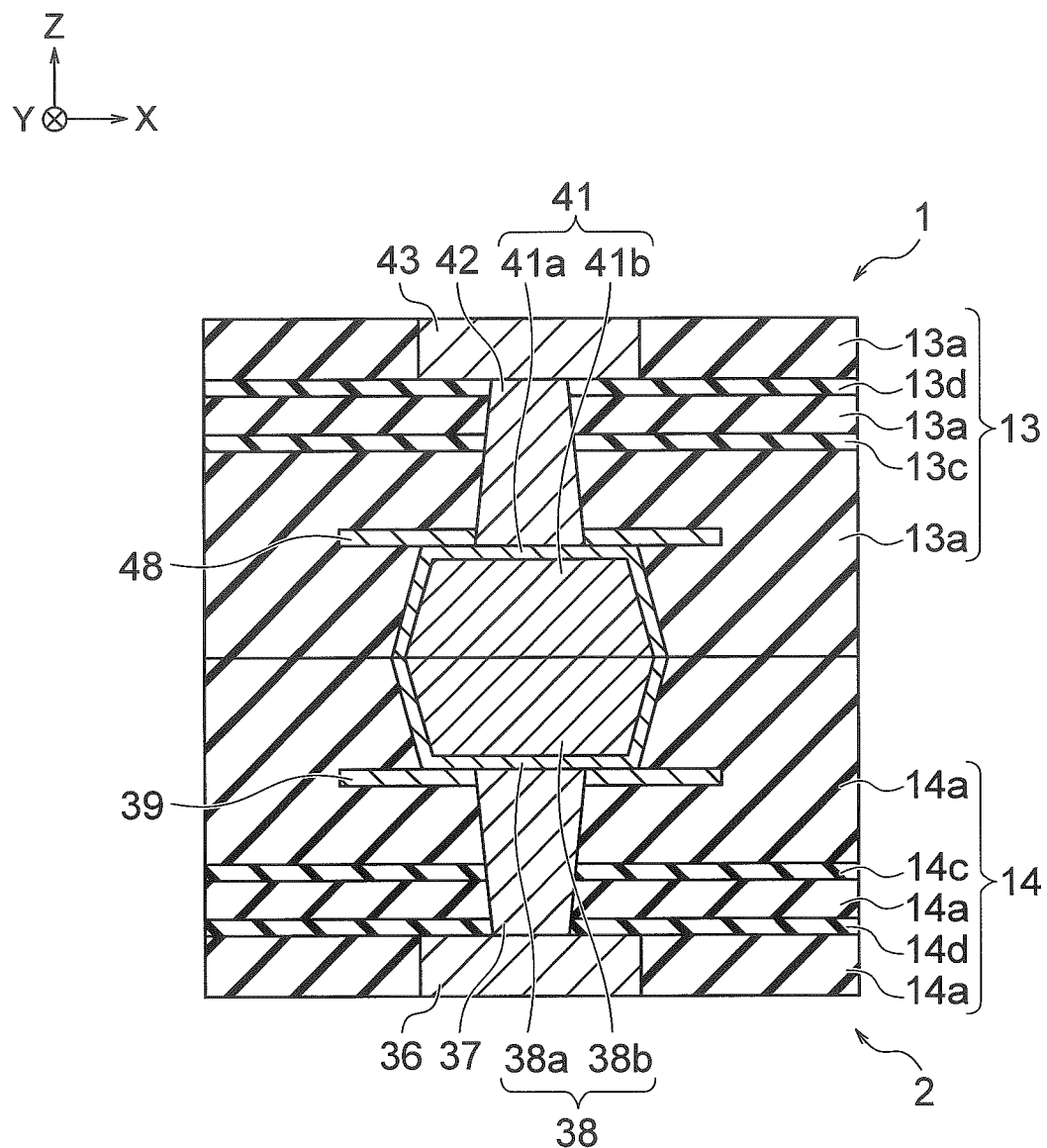
FIG. 17 is a cross-sectional view showing a structure of a semiconductor device of a first modification of the second embodiment.

FIG. 17 is a cross-sectional view showing a structure of a semiconductor device of a first modification of the second embodiment.

The metal layer 39 of the present modification is in contact with not only the via plug 37 but also the metal pad 38. Similarly, the metal layer 48 of the present modification is in contact with not only the via plug 42 but also the metal pad 41. According to the present modification, similarly to the second embodiment, by leveraging the property of greatly expanding of the metal layers 39, 48, the metal pads 38 and the metal pads 41 may be suitably joined.

Figure 18:
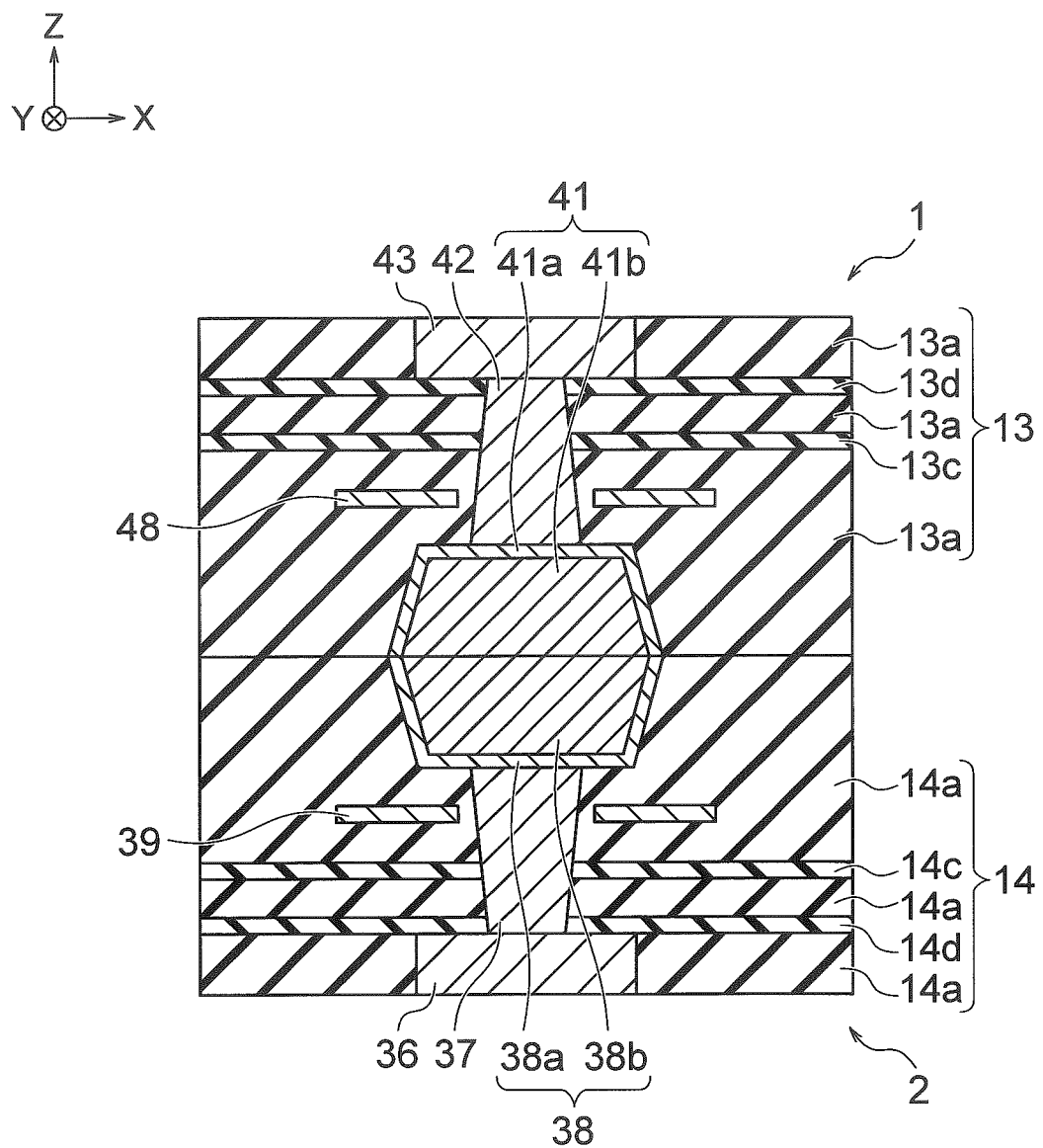
FIG. 18 is a cross-sectional view showing a structure of a semiconductor device of a second modification of the second embodiment.

FIG. 18 is a cross-sectional view showing a structure of a semiconductor device of a second modification of the second embodiment.

The metal layer 39 of the present modification surrounds the via plug 37 in a circular shape in a state of being spaced apart from the via plug 37, and is not in contact with the via plug 37. Similarly, the metal layer 48 of the present modification surrounds the via plug 42 in a circular shape in a state of being spaced apart from the via plug 42, and is not in contact with the via plug 42. According to the present modification, similarly to the second embodiment, by leveraging the property of greatly expanding of the metal layers 39, 48, the metal pads 38 and the metal pads 41 may be suitably joined.

Figure 19:
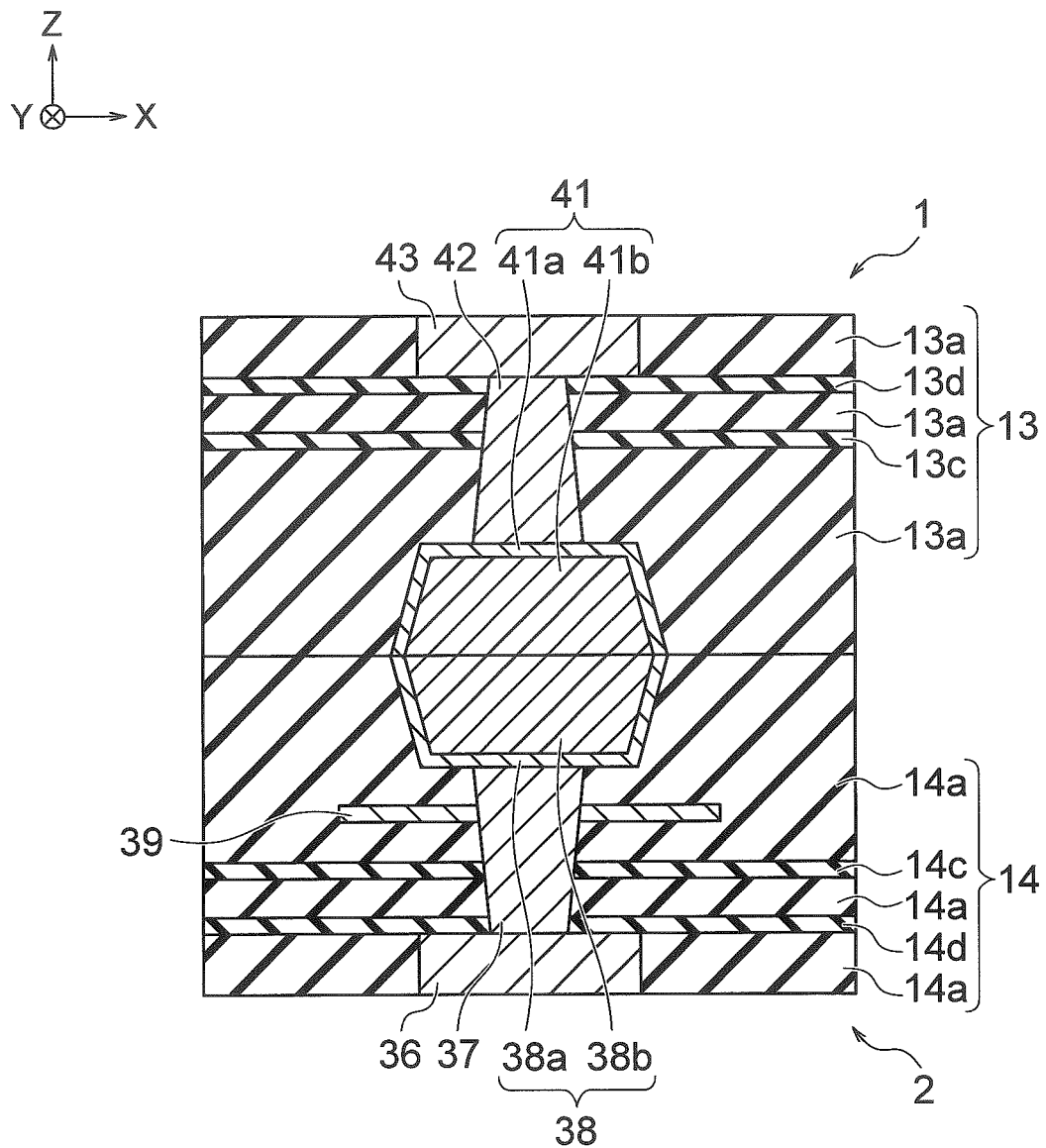
FIG. 19 is a cross-sectional view showing a structure of a semiconductor device of a third modification of the second embodiment.

FIG. 19 is a cross-sectional view showing a structure of a semiconductor device of a third modification of the second embodiment.

The semiconductor device of the present modification includes the metal layer 39 having the same shape as the metal layer 39 of the first embodiment, but not the metal layer 48. According to the present modification, by leveraging the property of greatly expanding of the metal layer 39, the metal pads 38 and the metal pads 41 may be suitably joined.

Figure 20:
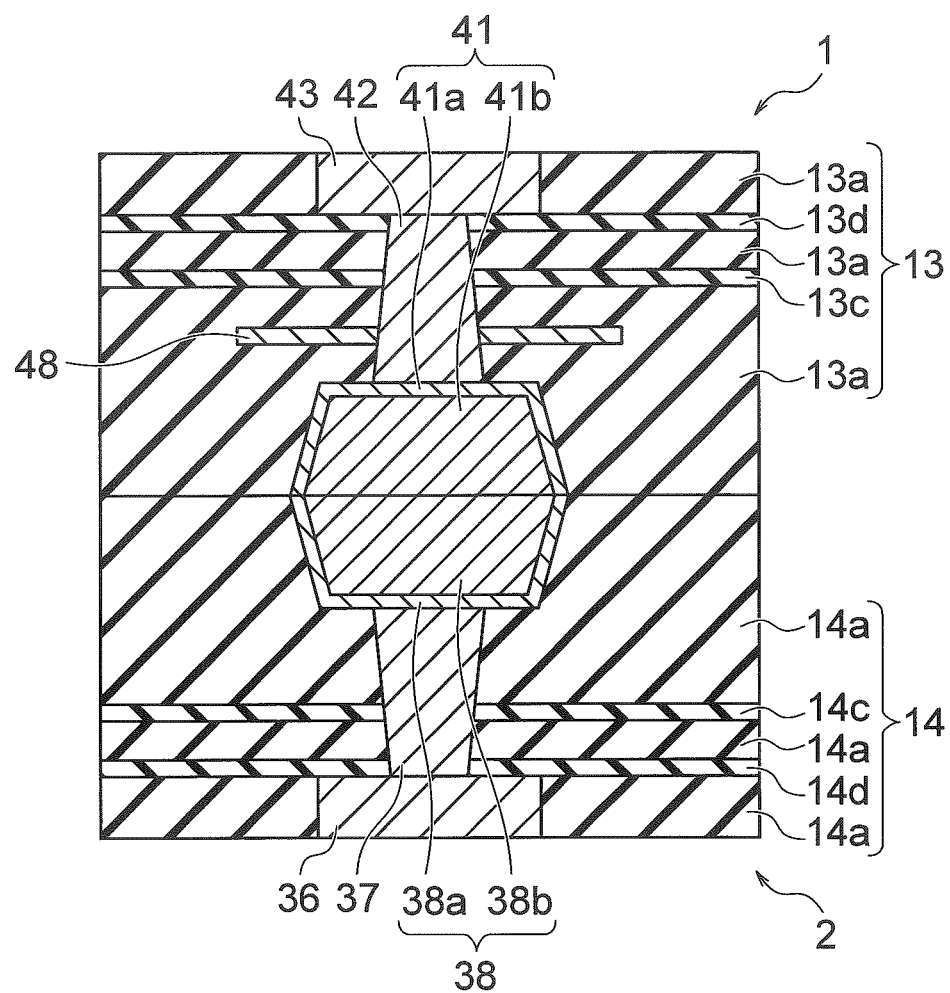
FIG. 20 is a cross-sectional view showing a structure of a semiconductor device of a fourth modification of the second embodiment.

FIG. 20 is a cross-sectional view showing a structure of a semiconductor device of a fourth modification of the second embodiment.

The semiconductor device of the present modification includes the metal layer 48 having the same shape as the metal layer 48 of the first embodiment, but not the metal layer 39. According to the present modification, by leveraging the property of greatly expanding of the metal layer 48, the metal pads 38 and the metal pads 41 may be suitably joined.

FIGS. 21A to 21C are cross-sectional views showing an outline of a method of manufacturing the semiconductor device of the second embodiment. FIGS. 21A to 21C show details of the method shown in FIGS. 3 and 4.

FIG. 21A shows the array region 1 (array wafer W1) before bonding to the circuit region 2 (circuit wafer W2) similarly to FIG. 10A. Also in FIG. 21A, the upper face of the metal pad 38 is recessed in a lower direction with respect to the upper face of the inter layer dielectric 14, and the lower face of the metal pad 41 is recessed in an upper direction with respect to the lower face of the inter layer dielectric 13. Even when the array region 1 is bonded to the circuit region 2, the metal pads 41 and the metal pads 38 may not be suitably joined due to these recesses.

FIG. 21B shows the array region 1 after bonding to the circuit region 2 and before annealing for joining the metal pads 38, 41, similarly to FIG. 10B. Also in FIG. 21B, a gap is caused between the metal pad 41 and the metal pad 38 due to the aforementioned recesses. Without filling the gap, joining defect between the metal pads 41 and the metal pads 38 is likely.

FIG. 21C shows the array region 1 after bonding to the circuit region 2 and after annealing for joining the metal pads 38, 41, similarly to FIG. 10C. Also in FIG. 21C, the gap between the metal pad 41 and the metal pad 38 is filled and the metal pad 41 and the metal pad 38 are suitably joined. This is due to thermal expansion of the metal pads 41, 38 by the annealing, and action of the metal layers 39, 48 by the annealing.

The action of the metal layers 39, 48 of the present embodiment is described hereinafter.

The pad material layers 38b, 41b in the metal pads 38, 41 of the present embodiment are for example Cu layers. On the other hand, the metal layers 39, 48 of the present embodiment are for example Al layers or Zn layers. Therefore, the linear expansion coefficients of the metal layers 39, 48 are greater than the linear expansion coefficients of the pad material layers 38b, 41b. As a result, when the metal pads 38, 41 and the metal layers 39, 48 are annealed, the thermal expansion rates of the metal layers 39, 48 are greater than the thermal expansion rates of the pad material layers 38b, 41b, whereby the metal layers 39, 48 greatly expand. As a result, a compressive stress is applied from the metal layers 39, 48 to the metal pads 41, 38, and facilitates approach between the metal pad 41 and the metal pad 38. Therefore, according to the present embodiment, due to the thermal expansion of the metal pads 41, 38 and further thermal expansion of the metal layers 39, 48, it is made possible to suitably join the metal pads 41 and the metal pads 38. The annealing of the metal pads 41, 38 of the present embodiment is preferably carried out at no greater than 400° C. in order to suppress a negative influence of the annealing to the Cu layers.

FIGS. 22A to 27B are cross-sectional views showing details of the method of manufacturing the semiconductor device of the second embodiment. FIGS. 22A to 27B show details of the method shown in FIGS. 21A to 21C.

Figure 22A:
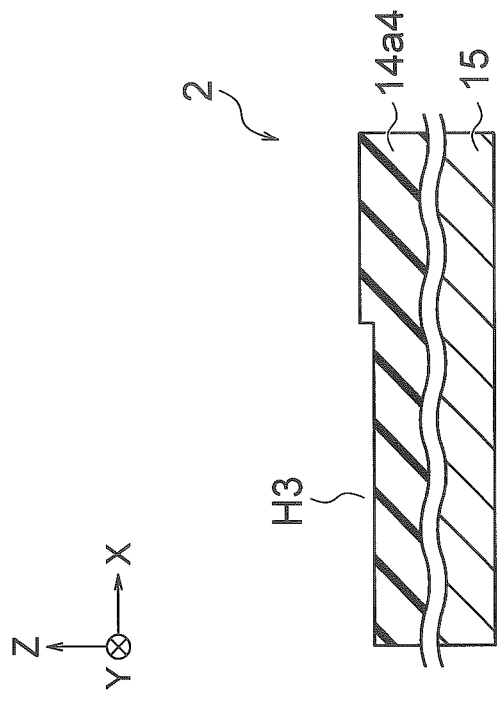

FIG. 22A shows a portion of the circuit region 2 (circuit wafer W2). When forming the circuit region 2, an insulator 14a4 is formed on an upper side of the substrate 15 (FIG. 21A). The insulator 14a4 is a portion of the insulator 14a, and formed by, for example, CVD by using dTEOS as a source gas. In the following description, description of the insulators 14c, 14d in the inter layer dielectric 14 (FIG. 16) is omitted.

Figure 22B:
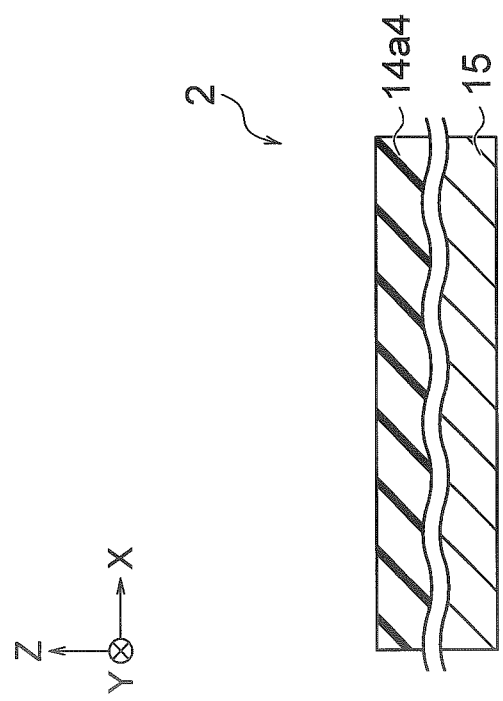

Next, a concave portion H3 is formed in the insulator 14a4 by lithography and RIE (FIG. 22B). Next, the metal layer 39 is formed in the concave portion H3 (FIG. 23A). The metal layer 39 is for example an Al layer or a Zn layer. The metal layer 39 of the present embodiment is formed by depositing the metal layer 39 inside and outside the concave portion H3 by CVD, and removing the metal layer 39 outside the concave portion H3 by CMP.

Figure 23B:
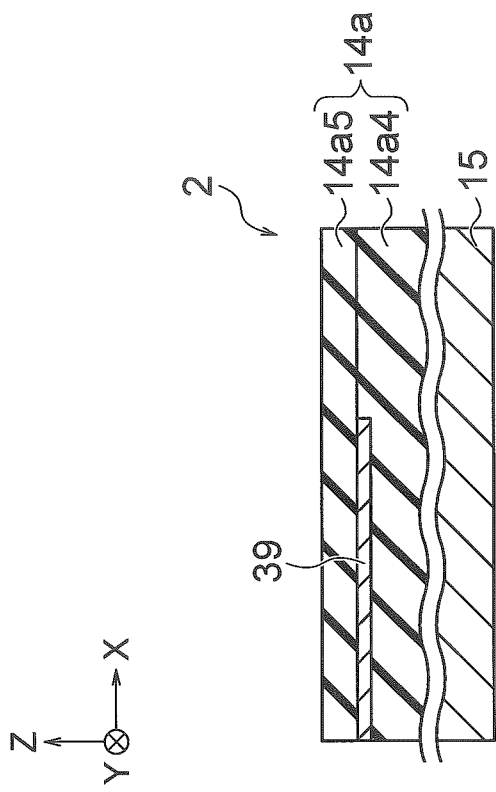
Figure 23A:
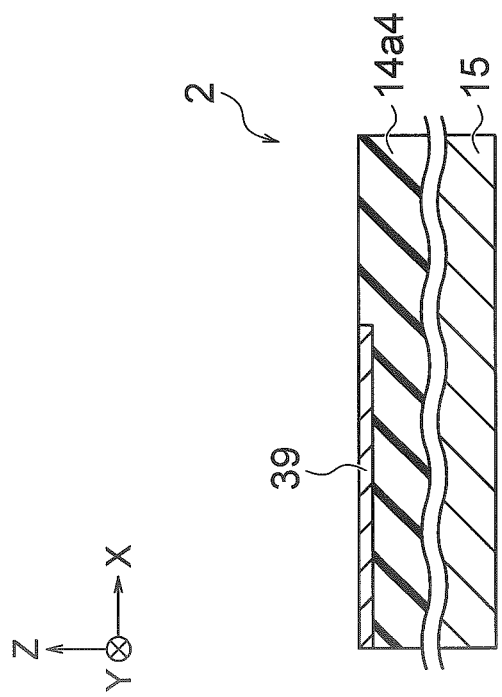

Next, an insulator 14a5 is formed on the insulator 14a4 and the metal layer 39 (FIG. 23B). The insulator 14a5 is a portion of the insulator 14a, and formed by, for example, CVD by using dTEOS.

Figure 24A:
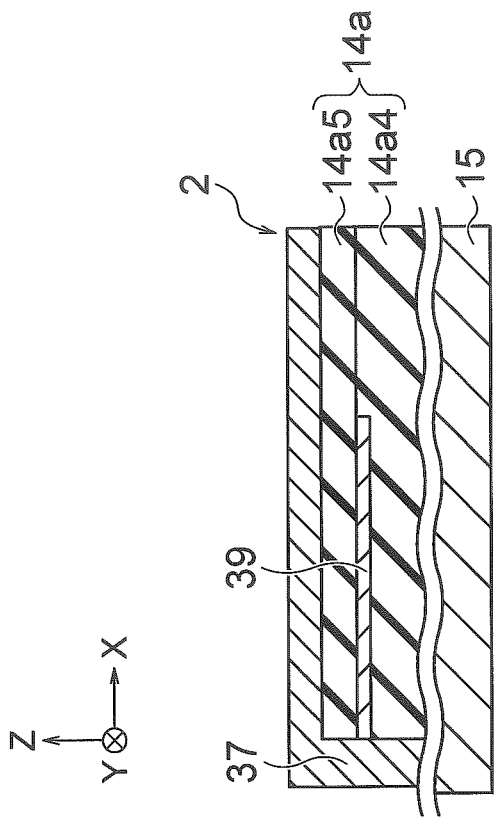

Next, a concave portion H4 is formed in the insulators 14a4, 14a5 and the metal layer 39 by lithography and RIE (FIG. 24A). As a result, an upper face of the interconnect layer 36, which is not illustrated, is exposed in the concave portion H4. The concave portion H4 is formed to penetrate the metal layer 39 and used as a via hole in which the via plug 37 is to be embedded.

Figure 24B:
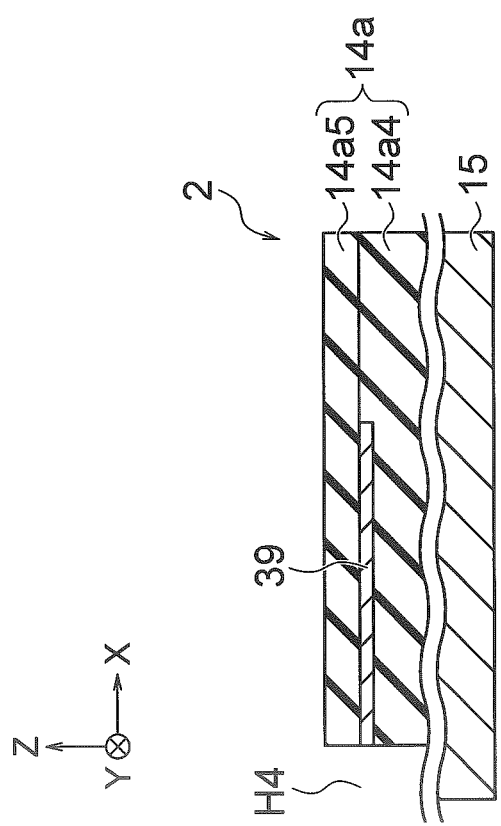

Next, a material for the via plug 37 is formed on the interconnect layer 36, which is not illustrated, and the insulator 14a5 (FIG. 24B). The material may be either the same as the material for the metal plug 38 or different from the material for the metal plug 38. In the former case, the via plug 37 is formed to include for example a Cu layer. In the latter case, the via plug 37 is formed to include for example a W (tungsten) layer. Next, the surface of the material is flattened by CMP (FIG. 25A). As a result, the material outside the concave portion H4 is removed, and the via plug 37 is formed in the concave portion H4 by the single damascene process. In FIG. 25A, the via plug 37 is in contact with the metal layer 39 and surrounded in a circular shape by the metal layer 39. Furthermore, in FIG. 25A, a thickness of the metal layer 39 is smaller than a thickness of the via plug 37, and the metal layer 39 is entirely positioned at the same height as a portion of the via plug 37.

Next, an insulator 14a6 is formed on the insulator 14a5 and the via plug 37 (FIG. 25B). The insulator 14a6 is a portion of the insulator 14a, and formed by, for example, CVD by using dTEOS. Next, a concave portion H5 is formed in the insulator 14a6 by lithography and RIE (FIG. 26A). As a result, an upper face of the via plug 37 is exposed in the concave portion H5. The concave portion H5 is used as a pad groove in which the metal pad 38 is to be embedded.

Next, the barrier metal layer 38a is formed on the via plug 37 and the insulators 14a5, 14a6 (FIG. 26B). The barrier metal layer 38a is for example a metal layer containing a Ti element or a Ta element, and is formed by CVD.

Figure 27B:
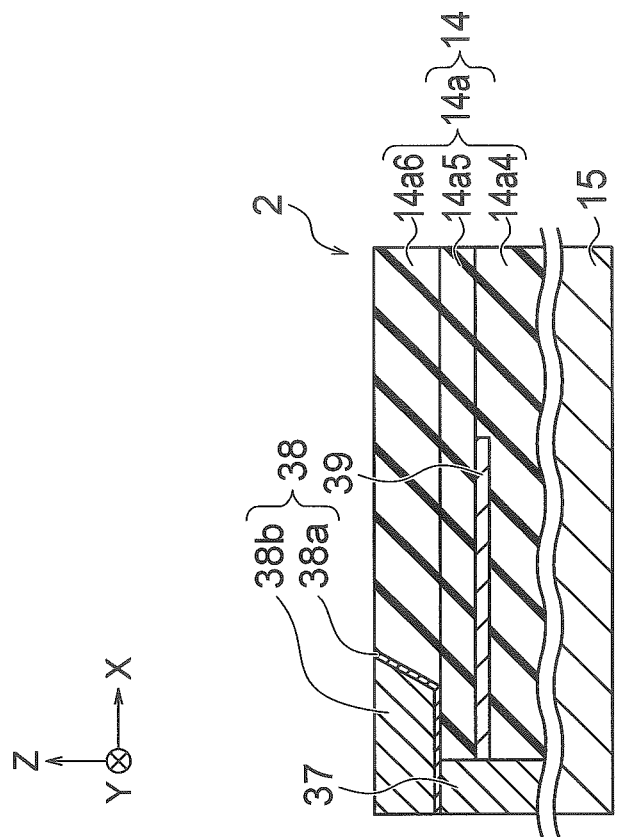
Figure 27A:
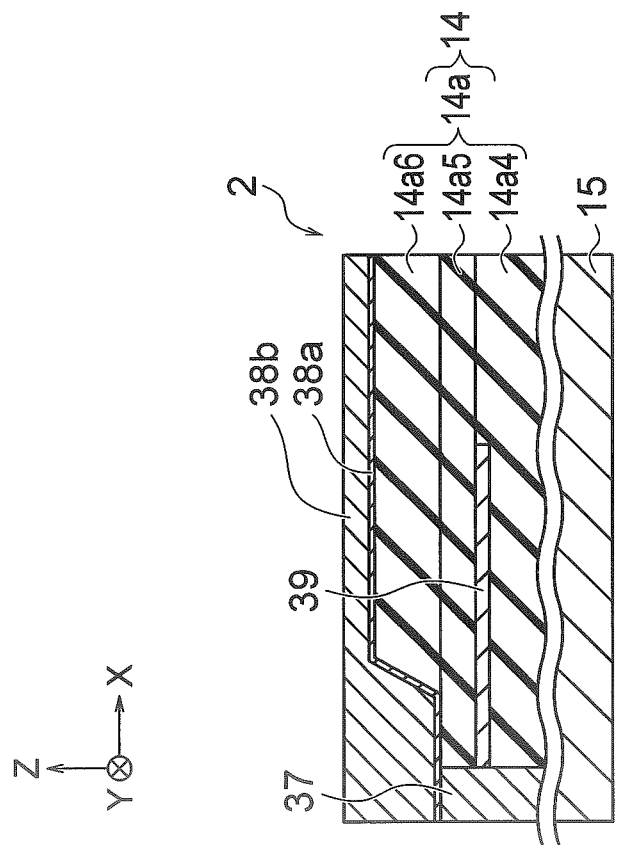

Next, the pad material layer 38b is formed on the via plug 37 and the insulators 14a5, 14a6 via the barrier metal layer 38a (FIG. 27A). The pad material layer 38b is for example a Cu layer and formed by a plating method.

Next, the surface of the pad material layer 38b is flattened by CMP (FIG. 27B). As a result, the barrier metal layer 38a and the pad material layer 38b outside the concave portion H5 are removed, and the metal pad 38 is formed in the concave portion H5 by the single damascene process. The metal pad 38 of the present embodiment is formed in a position in contact with the via plug 37, and not in contact with the metal layer 39.

FIG. 28A shows a portion of the array region 1 (array wafer W1). The array region 1 shown in FIG. 28A is formed by the steps shown in FIGS. 22A to 27B, similarly to the circuit region 2. However, the substrate 16, the insulators 13a4, 13a5, 13a6 in the insulator 13a, the via plug 42, the barrier metal layer 41a, the pad material layer 41b, the metal layer 48 and the like are respectively processed similarly to the substrate 15, the insulators 14a1, 14a2, 14a3 in the insulator 14a, the insulator 14b, the via plug 37, the barrier metal layer 38a, the pad material layer 38b, the metal layer 39 and the like. In FIG. 28A, illustration of the insulators 13c, 13d in the inter layer dielectric 13 (FIG. 16) is omitted.

Next, the substrate 15 is bonded to the substrate 16 such that the metal pads 41 are arranged on the metal pads 38, and the insulator 13a1 (inter layer dielectric 13) is arranged on the insulator 14a1 (inter layer dielectric 14) (FIG. 28B). Specifically, by bonding the inter layer dielectric 14 to the inter layer dielectric 13 by mechanical pressure, the inter layer dielectric 14 and the inter layer dielectric 13 are joined.

Furthermore, by annealing the metal pads 38, 41, the inter layer dielectrics 14, 13 and the like, the metal pads 41 and the metal pads 38 are joined. By the expansion of the metal layers 39, 48 during this annealing, joining of the metal pads 38, 41 can be promoted.

Thereafter, the substrate 15 is thinned by CMP, the substrate 16 is removed by CMP, and then the array wafer W1 and the circuit wafer W2 (see FIG. 4) are cut into a plurality of chips. As described above, the semiconductor device of the present embodiment shown in FIGS. 21A to 21C and the like is manufactured.

The metal layers 39, 48 formed by the method shown in FIGS. 22A to 28B may have the shape of any one of the first to fourth modifications of the present embodiment. The shape of the metal layer 39 can be controlled by adjusting the shape of the concave portion H3. Similarly, the shape of the metal layer 38 can also be controlled by adjusting the shape of a concave portion corresponding to the concave portion H3.

FIGS. 29A to 32B are cross-sectional views showing details of another method of manufacturing the semiconductor device of the second embodiment.

First, the steps shown in FIGS. 22A to 25B are carried out. However, the steps related to the via plug 37 (FIGS. 23A to 25A) are omitted. FIG. 29A shows the circuit region 2 (circuit wafer W2) after carrying out the step shown in FIG. 25B.

Figure 30A:
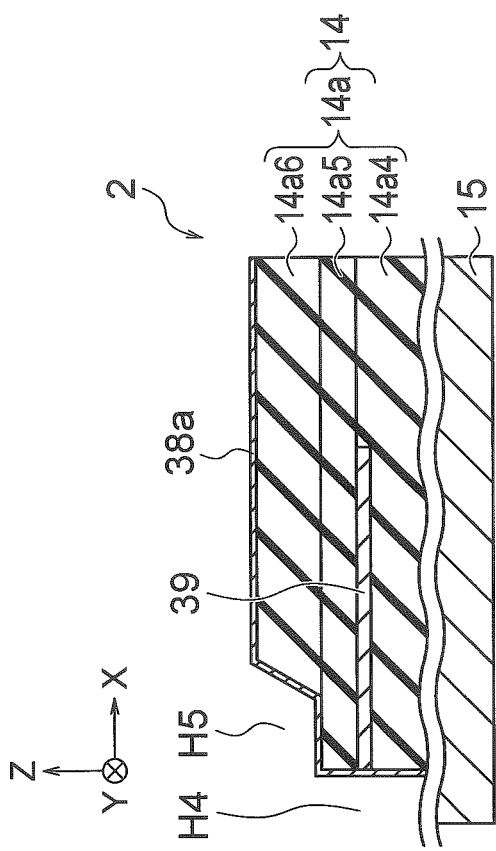

Next, a concave portion H5 is formed in the insulator 14a6 by lithography and RIE (FIG. 29B). Next, a concave portion H4 is formed in the insulators 14a5, 14a4 and the metal layer 39 positioned below the concave portion H5 by lithography and RIE (FIG. 30A). As a result, an upper face of the interconnect layer 36, which is not illustrated, is exposed in the concave portion H4.

Figure 30B:
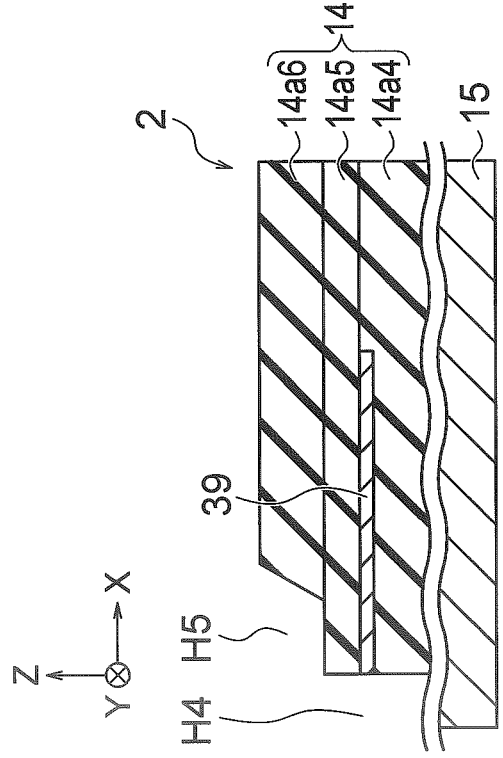

Next, the barrier metal layer 38a is formed on the interconnect layer 36, which is not illustrated, and the insulators 14a5, 14a6 (FIG. 30B). The barrier metal layer 38a is for example a metal layer containing a Ti element or a Ta element, and is formed by CVD.

Next, the pad material layer 38b is formed on the interconnect layer 36, which is not illustrated, and the insulators 14a5, 14a6 via the barrier metal layer 38a (FIG. 31A). The pad material layer 38b is for example a Cu layer and formed by a plating method.

Next, the surface of the pad material layer 38b is flattened by CMP (FIG. 31B). As a result, the barrier metal layer 38a and the pad material layer 38b outside the concave portions H4, H5 are removed, and the metal pad 38 and the via plug 37 are respectively formed in the concave portions H4, H5 by the dual damascene process. In this case, the via plug 37 is formed of the barrier metal layer 38a and the pad material layer 38b similarly to the metal pad 38.

FIG. 32A shows a portion of the array region 1 (array wafer W1). The array region 1 shown in FIG. 32A is formed by the steps shown in FIGS. 29A to 31B, similarly to the circuit region 2. However, the substrate 16, the insulators 13a4, 13a5, 13a6 in the insulator 13a, the via plug 42, the barrier metal layer 41a, the pad material layer 41b, the metal layer 48 and the like are respectively processed similarly to the substrate 15, the insulators 14a1, 14a2, 14a3 in the insulator 14a, the insulator 14b, the via plug 37, the barrier metal layer 38a, the pad material layer 38b, the metal layer 39 and the like.

Next, the substrate 15 is bonded to the substrate 16 such that the metal pads 41 are arranged on the metal pads 38, and the insulator 13a1 (inter layer dielectric 13) is arranged on the insulator 14a1 (inter layer dielectric 14) (FIG. 32B).

Specifically, by bonding the inter layer dielectric 14 to the inter layer dielectric 13 by mechanical pressure, the inter layer dielectric 14 and the inter layer dielectric 13 are joined. Furthermore, by annealing the metal pads 38, 41, the inter layer dielectrics 14, 13 and the like, the metal pads 41 and the metal pads 38 are joined. By the expansion of the metal layers 39, 48 during this annealing, joining of the metal pads 38, 41 can be promoted.

Thereafter, the substrate 15 is thinned by CMP, the substrate 16 is removed by CMP, and then the array wafer W1 and the circuit wafer W2 (see FIG. 4) are cut into a plurality of chips. As described above, the semiconductor device of the present embodiment shown in FIGS. 21A to 21C and the like is manufactured.

The metal layers 39, 48 formed by the method shown in FIGS. 29A to 32B may have the shape of any one of the first to fourth modifications of the present embodiment. The shape of the metal layer 39 can be controlled by adjusting the shape of the concave portion H3. Similarly, the shape of the metal layer 38 can also be controlled by adjusting the shape of a concave portion corresponding to the concave portion H3.

Figure 33:
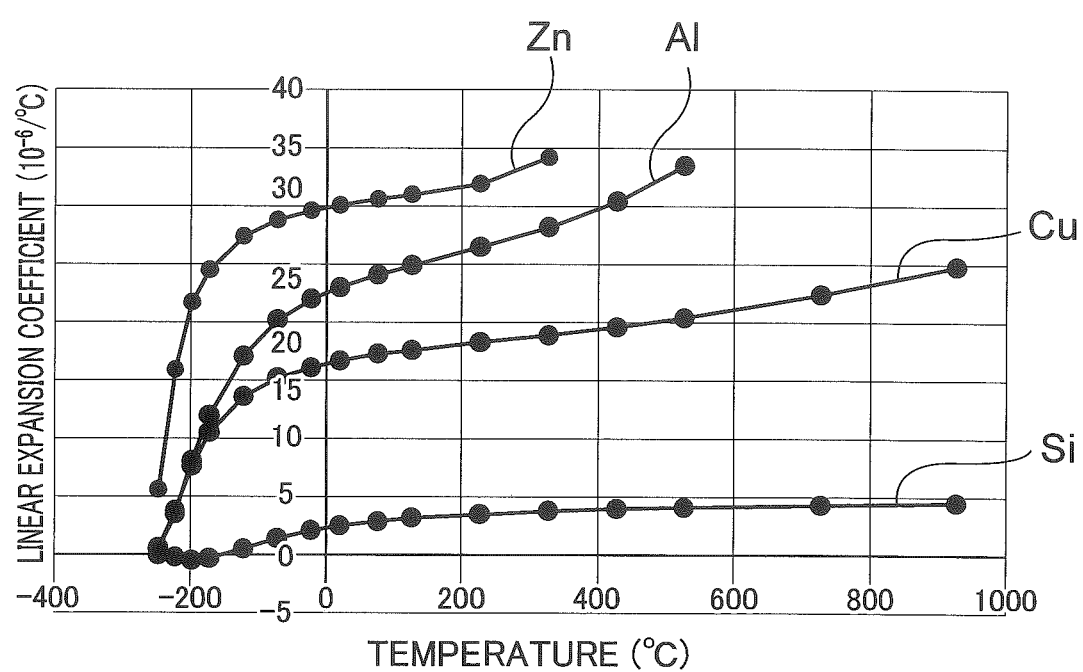
FIG. 33 is a graph for illustrating materials of the semiconductor device of the second embodiment.

FIG. 33 is a graph for illustrating materials of the semiconductor device of the second embodiment.

FIG. 33 shows temperature dependence of the linear expansion coefficients of silicon (Si), copper (Cu), aluminum (Al), and zinc (Zn). As shown in FIG. 33, magnitude of the linear expansion coefficients of these substances at the same temperature is in a relationship Zn>Al>Cu>Si, with almost all of the temperatures shown in FIG. 33. Therefore, in the present embodiment, by configuring the pad material layers 38b, 41b in the metal pads 38, 41 as Cu layers and configuring the metal layers 39, 48 as Al layers or Zn layers, the linear expansion coefficients of the metal layers 39, 48 can be made greater than the linear expansion coefficients of the pad material layers 38b, 41b in the metal pads 38, 41.

As described in the foregoing, in the semiconductor device of the present embodiment, the metal layer 39 is provided in the circuit region 2 and the metal layer 48 is provided in the array region 1. For example, the metal pads 38, 41 include Cu layers, while the metal layers 39, 48 are Al layers or Zn layers. Therefore, according to the present embodiment, due to the action of the metal layers 39, 48, it is made possible to suitably join the metal pads 38 and the metal pads 41.

The embodiments described above may be implemented as below.

(Appendix 1)

A method of manufacturing a semiconductor device, including:
  forming a first insulator on a first substrate;
  forming a first plug in the first insulator;
  forming a first pad on the first plug in the first insulator;
  forming, in the first insulator, a first layer having a linear expansion coefficient greater than a linear expansion coefficient of the first pad, and including a portion provided at a same height as at least a portion of the first plug;
  forming a second insulator on a second substrate;
  forming a second plug in the second insulator;
  forming a second pad on the second plug in the second insulator; and
  bonding the first substrate to the second substrate such that the second insulator is arranged on the first insulator, and the second pad is arranged on the first pad.

(Appendix 2)

The method of Appendix 1, wherein the first layer is formed before the first plug is formed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
  a first insulator;
  a first pad provided in the first insulator;
  a second insulator provided on the first insulator; and
  a second pad provided on the first pad in the second insulator, wherein
  the first insulator includes a first film that is in contact with the first pad and the second insulator, and a second film provided at an interval from the first pad and the second insulator, and including a portion provided at a same height as at least a portion of the first pad, and
  the first film and the second film include silicon and oxygen.

2. The device of claim 1, wherein the second insulator includes a third film that is in contact with the second pad and the first insulator, and a fourth film provided at an interval from the second pad and the first insulator, and including a portion provided at a same height as at least a portion of the second pad.

3. The device of claim 1, further comprising a substrate provided under the first insulator or on the second insulator.

4. The device of claim 1, wherein the second film has a nitrogen atom concentration higher than a nitrogen atom concentration in the first film.

5. The device of claim 1, wherein the first film includes a first portion provided between a lateral face of the first pad and a lateral face of the second film.

6. The device of claim 5, wherein the first portion has a circular planar shape surrounding the first pad.

7. The device of claim 6, wherein the first portion has a circular planar shape including a plurality of hexagons.

8. A method of manufacturing a semiconductor device, comprising:
  forming a first insulator on a first substrate;
  forming a first pad in the first insulator;
  forming a second insulator on a second substrate;
  forming a second pad in the second insulator; and
  bonding the first substrate to the second substrate such that the second insulator is arranged on the first insulator, and the second pad is arranged on the first pad, wherein
  the first insulator is formed to include a first film that is in contact with the first pad and the second insulator, and a second film provided at an interval from the first pad and the second insulator, and including a portion provided at a same height as at least a portion of the first pad, and
  the second film includes polysilazane.

9. The method of claim 8, wherein the second film shrinks by being heated after the bonding.

10. The method of claim 8, wherein a thickness of the second film is reduced by greater than 9% and no greater than 25% by shrinkage.

11. A semiconductor device comprising:
a first insulator;
a first plug provided in the first insulator;
a first pad provided on the first plug in the first insulator;
a first layer having a linear expansion coefficient greater than a linear expansion coefficient of the first pad, and including a portion provided at a same height as at least a portion of the first plug in the first insulator;
a second insulator provided on the first insulator;
a second pad provided on the first pad in the second insulator; and
a second plug provided on the second pad in the second insulator.

12. The device of claim 11, wherein the first layer includes a first metal layer.

13. The device of claim 11, wherein the first pad includes copper, and the first layer includes aluminum or zinc.

14. The device of claim 11, wherein a thickness of the first layer is no less than 5% and no greater than 30% of a thickness of the first pad.

15. The device of claim 11, wherein the first layer is in contact with the first plug.

16. The device of claim 11, wherein the first layer is provided at an interval from the first plug.

17. The device of claim 11, wherein the first layer is in contact with the first pad.

18. The device of claim 11, wherein the first layer is provided at an interval from the first pad.

* * * * *